US010228615B2

(12) United States Patent
Nikipelov et al.

(10) Patent No.: US 10,228,615 B2
(45) Date of Patent: Mar. 12, 2019

(54) MEMBRANES FOR USE WITHIN A LITHOGRAPHIC APPARATUS AND A LITHOGRAPHIC APPARATUS COMPRISING SUCH A MEMBRANE

(71) Applicant: ASML Netherlands B.V., Veldhoven (NL)

(72) Inventors: Andrey Alexandrovich Nikipelov, Eindhoven (NL); Vadim Yevgenyevich Banine, Deurne (NL); Jozef Petrus Henricus Benschop, Veldhoven (NL); Arjen Boogaard, Nijmegen (NL); Florian Didier Albin Dhalluin, Eindhoven (NL); Alexey Sergeevich Kuznetsov, Zaltbommel (NL); Mária Péter, Eindhoven (NL); Luigi Scaccabarozzi, Valkenswaard (NL); Willem Joan Van Der Zande, Bussum (NL); Pieter-Jan Van Zwol, Eindhoven (NL); Andrei Mikhailovich Yakunin, Mierlo (NL)

(73) Assignee: ASML Netherlands B.V., Veldhoven (NL)

(*) Notice: Subject to any disclaimer, the term of this patent is extended or adjusted under 35 U.S.C. 154(b) by 98 days.

(21) Appl. No.: 15/320,749

(22) PCT Filed: Jul. 2, 2015

(86) PCT No.: PCT/EP2015/065080
§ 371 (c)(1),
(2) Date: Dec. 20, 2016

(87) PCT Pub. No.: WO2016/001351
PCT Pub. Date: Jan. 7, 2016

(65) Prior Publication Data
US 2017/0205704 A1 Jul. 20, 2017

(30) Foreign Application Priority Data

Jul. 4, 2014 (EP) ..................................... 14175835
May 28, 2015 (EP) ..................................... 15169657

(51) Int. Cl.
*G03F 1/24* (2012.01)
*G03F 1/38* (2012.01)
*G03F 1/62* (2012.01)
*G06F 7/20* (2006.01)
*G02B 5/20* (2006.01)
*G03F 7/20* (2006.01)
*G02B 5/18* (2006.01)

(52) U.S. Cl.
CPC ............. *G03F 1/62* (2013.01); *G02B 5/1838* (2013.01); *G02B 5/208* (2013.01); *G03F 1/24* (2013.01); *G03F 1/38* (2013.01); *G03F 7/70191* (2013.01); *G03F 7/70316* (2013.01); *G03F 7/70575* (2013.01); *G03F 7/70891* (2013.01); *G03F 7/70916* (2013.01); *G03F 7/70958* (2013.01); *G03F 7/70983* (2013.01)

(58) Field of Classification Search
CPC ..... G03F 1/24; G03F 1/38; G03F 1/62; G03F 7/70191
USPC ........................................................... 430/5
See application file for complete search history.

(56) References Cited

U.S. PATENT DOCUMENTS

| 5,051,326 | A  | 9/1991  | Celler et al. |
| 5,110,373 | A  | 5/1992  | Mauger |
| 6,300,017 | B1 | 10/2001 | Rolfson et al. |
| 2002/0001760 | A1 | 1/2002 | Gianoulakis et al. |
| 2002/0163793 | A1 | 11/2002 | Jonkers |
| 2009/0274962 | A1 | 11/2009 | Kubota et al. |
| 2011/0143269 | A1 | 6/2011 | Yakunin et al. |
| 2011/0164237 | A1 | 7/2011 | Soer et al. |
| 2011/0292366 | A1 | 12/2011 | Glushkov et al. |
| 2012/0147350 | A1 | 6/2012 | Yakunin et al. |
| 2013/0019944 | A1 | 1/2013 | Hekmatshoar-Tabari et al. |
| 2014/0160455 | A1 | 6/2014 | Yakunin et al. |

FOREIGN PATENT DOCUMENTS

WO WO 2013/152921 10/2013
WO WO 2013/174656 11/2013

OTHER PUBLICATIONS

International Search Report and Written Opinion dated Oct. 23, 2015 in corresponding International Patent Application No. PCT/EP2015/065080.
Anonymous Author, "Mask pellicle frame structure for Extreme Ultraviolet (EUV) Lithography", Research Disclosure, Jan. 2012, vol. 573, 6 pages.
Akiyama, Shoji et al., "Development of EUV Pellicle with Single Crystal Silicon Membrane", 2010 International EUVL Symposium Kobe, Japan, Oct. 20-22, 2010, pp. 1-20, Downloaded from URL: http://www.sematech.org/meetings/archives/litho/8939/pres/RC-P07.pdf.

(Continued)

*Primary Examiner* — Christopher G Young
(74) *Attorney, Agent, or Firm* — Pillsbury Winthrop Shaw Pittman LLP

(57) ABSTRACT

A membrane transmissive to EUV radiation, which may be used as a pellicle or spectral filter in a lithographic apparatus. The membrane includes one or more high doped regions wherein the membrane is doped with a dopant concentration greater than $10^{17}$ cm$^{-3}$, and one or more regions with low (or no) doping. The membrane may have a main substrate having low doping and one or more additional layers, wherein the high doped regions are comprised within some or all of the additional layers.

28 Claims, 7 Drawing Sheets

(56) References Cited

OTHER PUBLICATIONS

Ravindra N. M. et al., "Modeling and Simulation of Emissivity of Silicon-Related Materials and Structures", Journal of Electronic Materials, vol. 32, 2003, pp. 1052-1058.

Matsumoto, Takahiro et al., "Perfect blackbody radiation from a graphene nanostructure with application to high-temperature spectral emissivity measurements", Optics Express, vol. 21, Dec. 16, 2013, pp. 30964-30974.

Liu, Baoan et al., "Broadband near-field radiative thermal emitter/absorber based on hyperbolic metamaterials: Direct numerical simulation by the Wiener chaos expansion method", Physical Review B, vol. 87, 2013, pp. 115403-1-115403-7.

MEMBRANES FOR USE WITHIN A LITHOGRAPHIC APPARATUS AND A LITHOGRAPHIC APPARATUS COMPRISING SUCH A MEMBRANE

CROSS-REFERENCE TO RELATED APPLICATIONS

This application is the U.S. national phase entry of PCT patent application no. PCT/EP2015/065080, which was filed on Jul. 2, 2015, which claims the benefit of priority of European patent application no. 14175835.9, which was filed Jul 4, 2014, and of European patent application no. 15169657.2, which was filed on May. 28 2015, which are incorporated herein in their entirety by reference.

FIELD

The present invention relates to membranes for use within a lithographic apparatus, and more specifically to EUV transmissive membranes which can form part of pellicle or optical filter components within the apparatus, and a lithographic apparatus comprising such a membrane.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where λ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength λ, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft X-ray radiation. Possible sources include, for example, laser-produced plasma sources, discharge plasma sources, or sources based on synchrotron radiation provided by an electron storage ring or based on free electron laser.

Thin transmissive EUV membranes are often required in EUV lithographic apparatus for a number of reasons. One such reason may be to protect, for example, reticles and/or lithographic components from contamination by particles (with a grain size ranging from nm to μm). Another reason may be to spectrally filter out unwanted radiation wavelengths from the generated EUV radiation.

The transmissive EUV membranes (or shortly EUV membranes) are required to be highly transparent to EUV radiation, and therefore need to be extremely thin. Typical EUV membranes have a thickness of 10 to 100 nm, to minimize absorption of EUV radiation.

EUV membranes may comprise a free-suspended (i.e. self-standing) membrane (a film) comprising a material such as polysilicon (poly-Si), produced by etching of a silicon wafer. EUV membranes may also comprise one or more layers of protective coatings (e.g. protective cap layers) on one or both surfaces to prevent EUV-induced plasma etching (for example induced by hydrogen (H, $H^+$, $H_2^+$ and/or $H_3^+$)).

Although absorption of EUV radiation by EUV membranes may be low, it is in practice still not zero and absorption of residual EUV radiation results in an increase in temperature of the EUV membrane. Because pellicles are in vacuum, the main process for pellicle cooling is radiative heat transfer. Should the temperature of an EUV membrane exceed a damage threshold (for example, about 500 to 700° C.), damage to the EUV membrane may occur. Damage can also occur, or be amplified, when there are large temperature gradients within the EUV membrane. Where such damage is severe, the EUV membrane may break, leading to damage/contamination of an unprotected reticle or other elements of the lithographic apparatus such as mirrors, or photoresist exposure to undesired non-EUV wavelength radiation, leading to a significant manufacturing process downtime.

It is apparent that maintaining the temperature of the EUV membrane below the damage threshold, as well as minimizing temperature gradients, can increase the EUV membrane lifetime.

The reason that pellicles may fail due to heat load is that they do not absorb/emit IR radiation very well, especially for high power EUV radiation sources such as 125 Watt sources and beyond. Since thermal radiation is emitted in the IR wavelength region, a high spectral (IR) hemispherical emissivity enables a substantial heat loss for EUV membranes. It is therefore desirable to manufacture EUV pellicles which have a high spectral emissivity. Also, EUV pellicles need to be very thin if a rage amount of EUV radiation such as 90% or more is to be transmitted through an EUV membrane.

SUMMARY

It is desirable to improve the thermal characteristics of EUV membranes, such as improved cooling and/or minimization of temperature gradients within the EUV membranes. Herein an EUV membrane means a membrane substantially transmissive to EUV radiation and is also referred to as EUV pellicle. By substantially transmissive (or simply transmissive) to EUV radiation herein is meant to be transmissive for at least 65% EUV radiation, preferable for at least 75% EUV radiation, more preferably at least 85% EUV radiation and most preferable at least 90% EUV radiation in order to provide sufficient EUV dose during exposure.

In order to increase an EUV pellicle emissivity to IR radiation while EUV transmission is still substantial, it is herein proposed to:

a) dope the EUV pellicle with impurities; and/or
b) coat the EUV pellicle with a cap layer for improved IR emissivity comprising a material which is good absorber for IR radiation but transparent in the EUV radiation regime, for example with a metal cap layer. Such a cap layer preferably also will protect the pellicle from oxidation or other environmental hazards. The EUV pellicle may be chosen to be transmissive for 90% or more of a given EUV radiation wavelength, such as 13.5 nm or 6.8 nm (or any other EUV radiation wavelength).

Herein by improved (increased, enhanced, optimal) IR emissivity of a EUV membrane according to the invention or EUV membrane assembly is meant that the IR emissivity is more than 0.1, such as more than 0.15 and preferably more than 0.2. Preferably the IR emissivity of the EUV membrane is increased by at least a factor 2 for a given temperature.

If the EUV membrane (i.e EUV pellicle) is formed by a core layer (also referred to as a main substrate layer) and one or more cap layers (also referred herein as cover layers, being generally layers with a specific functionality such as a protective cap layer) from which at least one cap layer having the function to improved IR emissivity, then by cap layer for improved IR emissivity is meant a cap layer with an IR emissivity selected such that the IR emissivity of the EUV membrane is larger than the IR emissivity of the core layer. For example, if the EUV emissivity of the core layer is about 0.1, then the material and thickness of the cap layer for improved IR emissivity is selected such that the total IR emissivity of the EUV membrane determined in same conditions is more than 0.15. Although cap layer is mainly referred herein as a coating which may be provided on the top of a core layer, it is herein understood that a cap layer may also be a layer in between two core layers, or in between core layer and another (second) cap layer, or between two cap layers of same or different functionality (e.g. protective such as anti-oxidant layer, anti-diffusive, or for improved IR emissivity).

By core layer or main substrate layer herein is generally understood a thicker layer, a multilayer stack or a layer of high yield strength material which also provides most of the mechanical strength for the EUV membrane. For example, in order to withstand large stresses that may occur during exposure due to the high thermal load the core layer may need to have a yield strength of at least 50 MPa, preferably at least 100 MPa, even more preferably at least 150 MPa. Generally, a yield strength in the range of 50 to 1000 MPa may provide sufficient mechanical strength to the EUV membrane depending on the material (for example p-Si has about 180 MPa and SiNx has about 500 MPa yield strength) Generally, the thickness of the core layer may be larger than the thickness of the cap layer for improved emissivity. When the core layer is formed by a multilayer stack, the total thickness of the stack may be larger than the thickness of the cap layer for improved emissivity, even though the thickness of individual layers in the multilayer stack may be comparable with the thickness of the cap layer for improved emissivity. However, depending on the materials of the core and cap layers, the EUV membrane can also be designed to have comparable thicknesses or even the cap layer for improved emissivity to be somewhat thicker than the core layer, as long as desired requirements for EUV transmission, DUV supression and/or IR emissivity are met.

If the EUV membrane (EUV pellicle) is doped to increase its emissivity, by improved IR emissivity of the EUV membrane is meant as the IR emissivity of the doped EUV membrane is larger than the IR emissivity of the non-doped EUV membrane of same material and thickness, at same conditions.

In an alternative definition of the improved emissivity also the temperature may be taken as defining parameter. For example, improving the IR emissivity of an EUV membrane can also be defined as increasing the thermal emissivity of the EUV membrane for the wavelengths (for example 1 to 10 µm) such that more than 65% (preferably more than 85%) of the energy absorbed by the EUV membrane is radiated away when the temperature of the EUV membrane ranges from 100 to about 1000° C., and more specifically at moderate temperatures (less than 500° C.).

By emissivity herein is generally meant the hemispherical emissivity (based on hemispherical IR radiation absorption), unless otherwise stated.

In an aspect of the invention there is provided a membrane transmissive to EUV radiation which is doped with donor and/or acceptor impurities as to increase the IR emissivity of the EUV pellicle. It has been found the doping range needed in order to match the plasmon resonance to the peak in the Planck spectrum as to maximize IR emissivity (i.e. The Planck emissivity peak corresponds to the plasmon resonance). For example, by doping (poly-)silicon a plasmon in the IR is created at around 1-10 microns, which coincides with the peak Planck black body radiation. The plasmon frequency is easily determined from the number of conductors. The volume density of atoms is roughly $10^{22}$ n/cm$^3$ for solids. In case of a metal each atom contributes with an electron in the conduction band, resulting in about $10^{22}$ carriers/cm$^3$. A metal has a typical plasma wavelength of the order of 150 nm.

The plasma frequency $\omega_p$ is proportional to $\omega_p = \sqrt{n_e}$ with $n_e$ the free charge carrier. If a 10× larger wavelength is desired (i.e. the frequency is 10× lower), a 100× lower free charge carrier density is needed which corresponds to $10^{20}$ carriers. It follows that if (poly-)silicon is doped with 0.1-10% atom concentration of a dopant, then a plasmon resonance may be created in IR radiation spectrum. This plasmon couples to the Planck black body spectrum and creates additional IR absorption.

If the plasmon resonance frequency is much higher than the Planck frequency (10 micron at 300 K), then the EUV pellicle may become more reflective. (i.e. metallic-like). If the plasmon resonance frequency is much lower than the Planck frequency then the EUV pellicle becomes more transmissive (i.e. dielectric-like). The desired behavior for the EUV pellicle is a semi-metallic behavior where the plasma wavelength is between 1 and 10 microns.

From theoretical calculations it was found that an optimal IR emissivity of a 60 nm thick polysilicon pellicle is obtained with having N-type doping of an EUV pellicle material with at least about (2 to 3)×$10^{20}$ n/cm$^3$ donor atoms. The higher the pellicle temperature, the higher the doping concentration should be due to the shift of Planck spectrum at higher temperatures. The optimal doping in case of P-type doping of an EUV pellicle material was found to be at least 4×$10^{20}$ n/cm$^3$ acceptor atoms. P-type doping results in slightly (about 10%) higher IR emissivity than N-type doping. Compared with a 60 nm thick polysilicon pellicle, a thinner pellicle would have a higher optimal doping concentration (e.g. 20 nm thick pellicle has optimal doping around $1e^{21}$) and a thicker pellicle would have a lower optimal doping concentration (200 nm thick Si pellicle has optimal doping around $1e^{20}$). Generally, for an EUV pellicle with a thickness between 10 and 250 nm the optimal dopant concentration ranges from $5\times10^{19}$ to $1\times10^{21}$ n/cm³ atoms.

In an aspect of the invention there is provided a membrane transmissive to EUV radiation comprising: one or more high doped regions where said membrane is doped with a high dopant concentration, and one or more low doped regions where said membrane has no doping or a low dopant concentration; wherein a high dopant concentration is defined as dopant concentration greater than $10^{17}$ cm³, preferably greater than $10^{20}$ cm$^{-3}$; and a low dopant concentration is defined as a dopant concentration less than $10^{17}$ cm³, preferably less than $10^{20}$ cm$^{-3}$.

In another aspect of the invention there is provided a membrane transmissive to EUV radiation (EUV pellicle) having a (core) material selected from (poly-)Si, Si3N4, SiC, ZrN, $ZrB_2$, ZrC, MoB2, MoC, $RuB_2$, $LaB_2$, LaC, $TiB_2$, TiC, (poly-)crystalline Yttrium, (poly-)crystalline Zr, Be, C, B and $B_4C$ and composites or combinations of multilayers therefrom. Semi-metals such as $ZrB_2$ or ZrC may reduce the electrostatic charging of the EUV pellicle. The EUV pellicle has preferably a thickness of 60 nm or less to allow sufficient EUV transmission.

In another aspect of the invention there is provided a membrane for a lithographic apparatus having IR radiation emissivity of at least 0.1 and being substantially transmissive to EUV radiation of 6.7 nm wavelength, the membrane comprising a core layer from a material comprising boron, wherein the core layer has a thickness from 20 to 150 nm.

In another aspect of the invention there is provided a membrane for a lithographic apparatus having IR radiation emissivity of at least 0.1 and being substantially transmissive to EUV radiation, the membrane comprising a core layer from a material comprising Ru, wherein the core layer has a thickness from 20 to 30 nm.

In another aspect of the invention there is provided a membrane assembly for a lithographic apparatus having IR radiation emissivity of at least 0.1 and being substantially transmissive to EUV radiation, the membrane assembly comprising at least two independent metal layers for improved IR emissivity, the metal layers comprising a metal which absorbs IR radiation and have a layer thickness of 20 nm or less such that they are substantially transparent for EUV, wherein the metal layers for improved IR emissivity are separated by a gap with thickness D of 10 microns or less. The metal layers may be supported with a support layer which provides mechanical strength.

In another aspect of the invention there is provided a lithographic apparatus comprising one or more EUV membranes according to the above embodiments.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

The features and advantages of the present invention will become more apparent from the detailed description set forth below when taken in conjunction with the drawings.

DETAILED DESCRIPTION OF EXEMPLARY EMBODIMENTS

Figure 1:
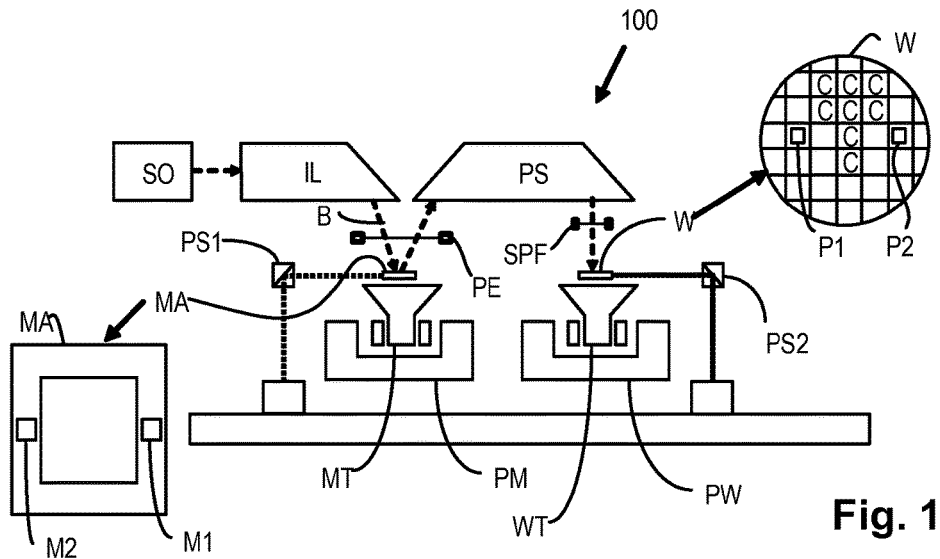
FIG. 1 depicts schematically a lithographic apparatus having reflective projection optics.

FIG. 1 schematically depicts a lithographic apparatus 100 including a source module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

An EUV membrane, for example an EUV pellicle PE, is provided to prevent contamination of the patterning device from particles within the system. Such pellicles may be provided at the location shown and/or at other locations. A further EUV membrane SPF may be provided as a spectral purity filter, operable to filter out unwanted radiation wavelengths (for example DUV). Such unwanted wavelengths can affect the photoresist on wafer W in an undesirable manner. The SPF may also optionally help prevent contamination of the projection optics within projection system PS from particles released during outgassing (or alternatively a pellicle may be provided in place of the SPF to do this). Either of these EUV membranes may comprise any of the EUV membranes disclosed herein.

Figure 2:
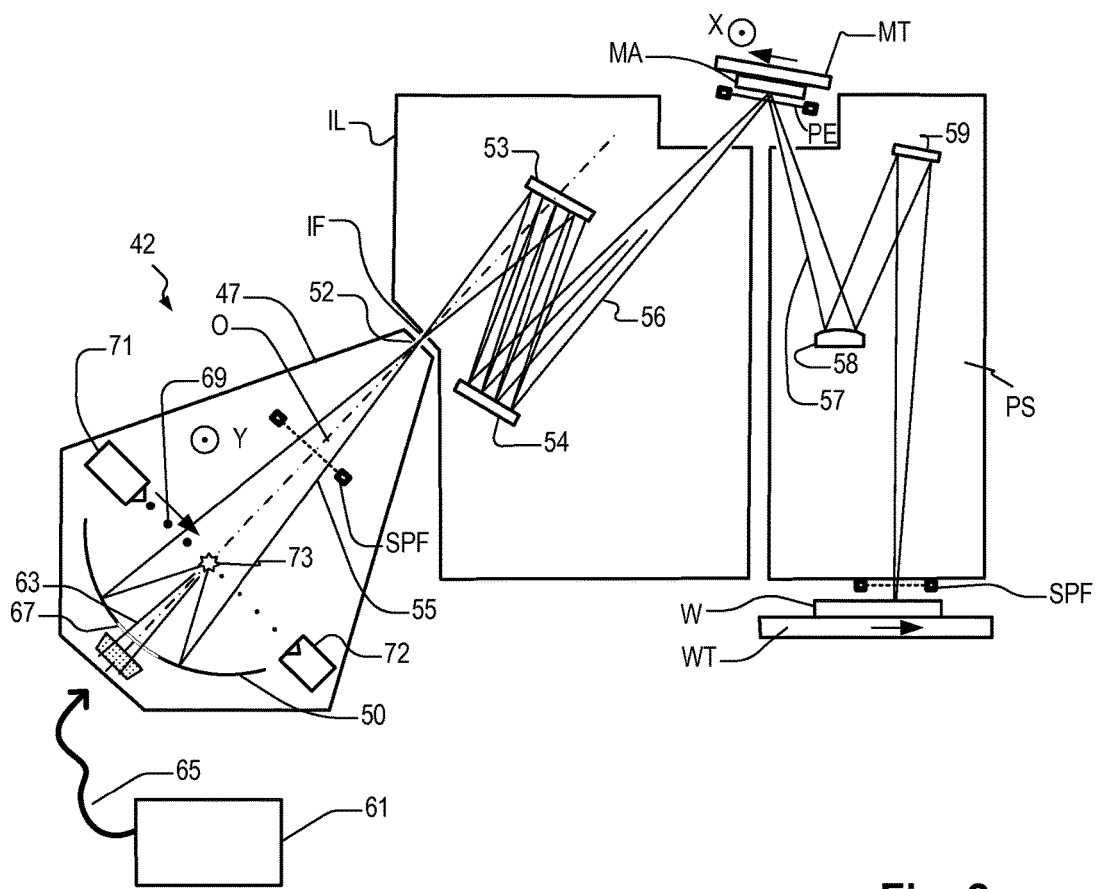
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector 50 which, in the example of FIG. 2, is a normal-incidence collector, for instance a multilayer mirror.

As part of an LPP radiation source, a laser system 61 is constructed and arranged to provide a laser beam 63 which is delivered by a beam delivering system 65 through an aperture 67 provided in the collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. A trap 72 is provided on the opposite side of the source chamber 47, to capture fuel that is not, for whatever reason, turned into plasma. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several $10^5$ K. Higher energy EUV radiation may be generated with other fuel materials, for example Tb and Gd. The energetic radiation generated during de-excitation and recombination of these ions includes the wanted EUV which is emitted from the plasma at position 73. The plasma formation position 73 and the aperture 52 are located at first and second focal points of collector 50, respectively and the EUV radiation is focused by the normal-incidence collector mirror 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56, via pellicle PE, onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR (infrared) radiation present from the laser beam 63. The non-EUV wavelengths are not wanted in the illumination system IL and projection system PS and various measures may be deployed to block the non-EUV radiation. As schematically depicted in FIG. 2, an EUV membrane filter in the form of a spectral purity filter SPF (i.e. an SPF membrane) may be applied upstream of the virtual source point IF, for IR, DUV and/or other unwanted wavelengths. In the specific example shown in FIG. 2, two spectral purity filters are depicted, one within the source chamber 47 and one at the output of the projection system PS. In one embodiment only one spectral purity filter SPF membrane is provided, which may be in either of these locations or elsewhere between the plasma formation position 73 and wafer W, such as at the reticle level.

Large DUV suppression may however be difficult at reticle level, since at that location back-reflection of out-of-band radiation is undesired (since it can affect the reticle shape). Therefore at reticle level the preferred mechanism to suppress DUV and IR with a EUV membrane (e.g. EUV pellicle) is absorption only.

In another embodiment a first EUV membrane may be used at the reticle level to suppress particle debris depositing on the reticle and a second EUV membrane may be used as a SPF membrane at the output of the projection system PS (i.e. between the wafer and the last mirror of the projection system PS). The SPF membrane is a EUV membrane operated as a spectral filter for blocking unwanted wavelengths of radiation. The SPF membrane may be added in order to suppress out of band IR and DUV radiation, since near the wafer both reflection and absorption may be used to suppress the unwanted radiation.

Disclosed is an EUV membrane for transmission of EUV radiation, having improved thermal characteristics compared to present EUV membranes. Such EUV membranes may comprise, for example (poly-)Si EUV membranes. The membranes may be comprised within a spectral purity filter (SPF) or a pellicle. SPFs and/or pellicles may be provided at many locations within a lithographic system, as already described.

In absorbing radiation during use, the EUV membranes heat up. Should their temperature increase too high or the temperature gradients within the membrane be too great, the EUV membranes can be damaged. Therefore it is desirable to minimize temperature and temperature gradients within the EUV membrane. As the EUV membranes will be used in very low pressure (vacuum) environments, the only means of cooling is radiation. It is therefore desirable to increase thermal emissivity ((i.e. improve IR emissivity) of the EUV membrane for the wavelengths (for example 1 to 10 μm) at which most energy is radiated when the temperature of the EUV membrane ranges from about 100 to about 1000° C., more preferably from few hundred (e.g. at least 200° C.) to about 1000° C., and more specifically at moderate temperatures (less than 500° C., such as from 100 to 500° C.). In these conditions for example a pure (i.e. bulk) layer of (poly-)silicon material presents a low thermal emissivity, since all free charge carriers are still bound.

Simulations based on multilayer Fresnel reflection coefficients and Planck's law for calculating the hemispherical infrared absorption (which relates to emissivity) have been done to understand the change in IR absorption (thermal emissivity) of thin membranes as a function of their thickness. Such simulations have shown that films of dielectric materials such as SiC and Si will become less IR radiation absorptive as they get thinner. Therefore, EUV membranes from dielectric materials (which are required to be thin to provide a substantial EUV transmission) will generally have little IR absorption/emission on their own.

To increase emissivity in an EUV membrane comprising a semiconductor material, the EUV membrane material may be doped to increase the number of free charge carriers within the material. This increases the radiation absorption coefficient of the doped membrane, which leads to an increase in the emissivity. The skilled reader will know that doping of semiconductor materials with donors and/or acceptors modifies the free charge carrier concentration (electrons and/or holes) at moderate temperatures.

The concentration of impurity to be doped into the semiconductor membrane should be higher than $10^{17}$ cm$^{-3}$ for a significant effect. Concentrations may preferably be higher than $10^{18}$ cm$^{-3}$, $10^{19}$ cm$^3$ or $10^{20}$ cm$^{-3}$ It can be shown that absorption coefficients can increase by a factor of 1000 at radiation wavelengths greater than 1.2 μm when the dopant concentration is increased from $10^{17}$ cm$^{-3}$ to $10^{20}$ cm$^{-3}$. This applies equally to doping with p-dopants and n-dopants.

However, adding dopants tends to reduce the strength of semiconductor material such as polysilicon. This is particularly a problem from EUV membranes due to their need to be particularly thin in order to transmit the EUV radiation with the minimum amount of loss. Consequently a number of solutions are proposed to address this.

Figure 3:
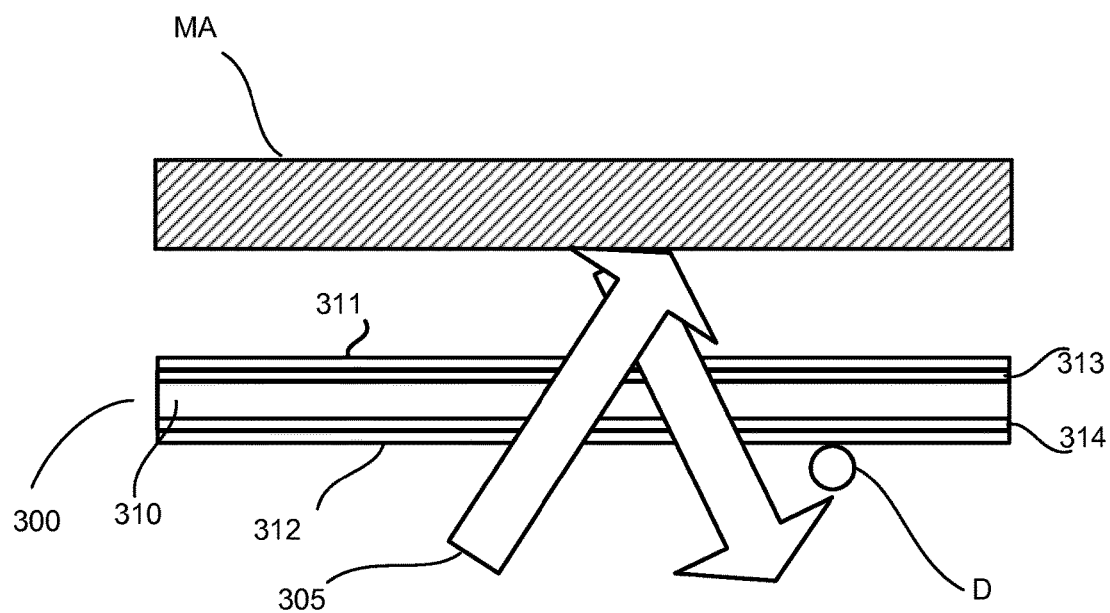
FIG. 3 illustrates an EUV membrane according to a first embodiment of the invention being used as a pellicle for a reticle.

FIG. 3 is a schematic diagram of a EUV membrane 300 which is positioned in front of the patterned area of a reticle MA. EUV membrane 300 is shown here as forming part of a pellicle designed to keep particles D off the patterned area of reticle MA, while allowing transmission of EUV radiation beam 305. In such an example EUV membrane 300 may comprise an EUV membrane within a pellicle frame (not shown). The EUV membrane 300 may further comprise (for example) securing elements for attaching the pellicle frame to the reticle (not shown). EUV membrane 300 may be placed out of the focal plane, at some distance from reticle MA, such that contaminants are not imaged onto the wafer.

In other embodiments, EUV membrane may form part of a pellicle for use in another location within a lithographic apparatus, or an SPF.

The EUV membrane 300 may comprise a number of layers. These layers may include the main substrate layer 310, cover layers 311, 312, and intermediate layers 313, 314 which may be for example anti-diffusion layers 313, 314. The main substrate layer 310 may be, for example, a (poly-)Si layer. This arrangement is shown by way of example only, and other combinations of the layers shown are possible. For example, the EUV membrane 300 may comprise cover layers 311, 312 without any intermediate layers. In another exemplary alternative, there may be only one cover layer on just one surface of the main substrate layer (with or without an intermediate layer between cover layer and substrate layer). There could also be more than two layers on one or both surfaces of the main substrate layer.

Typically, cover layers 311, 312 are made of a (inert) material to resist any etching or reacting agents that can harm the main substrate layer 310, e.g., O and H radicals, $H_2$ and EUV. Examples of such a material include $MoSi_2$, $Si_3N_4$, $C_3N_4$, ZrN, SiC. Such materials typically have a wide forbidden energy zone and are similar in properties to ceramics. Consequently, such materials have high emissivity even at moderate temperatures, for example less than 500° C. Moreover these materials are produced from elements with low absorption of EUV, which is comparable with pure Si absorption. Therefore, provided that the cover layers 311, 312 have a much smaller thickness than main substrate layer 310, they do not significantly increase overall EUV absorption of EUV membrane 300. The cover layers 311, 312 should also not place too great a stress on the main substrate layer 310, so as to preserve its mechanical properties.

Intermediate layers 313, 314 may be provided to reduce the stress. For example intermediate layers 313, 314 may comprise material having an intermediate lattice size between the main substrate layer 310 and cover layer 311, 312. Intermediate layers 313, 314, like the cover layers 311, 312, should be highly transparent to EUV.

In an embodiment, the covers layers 311, 312, and/or the intermediate layers 313, 314 (if present) may be doped to increase the concentration of free charge carriers, as already described. In this way the covers layers 311, 312, and/or the intermediate layers 313, 314 form high doped regions within the membrane. The main substrate layer 310 may be formed as a low doped region to maintain strength. The doping of one or more of the other layers 311, 312, 313, 314 significantly increases emissivity of the EUV membrane 300 as already described.

High doped regions have a dopant concentration of at least $10^{17}$ cm$^{-3}$, while low doped regions have a dopant concentration less than $10^{17}$ cm$^{-3}$ Doping levels of the high doped regions may be any of those described above, in relation to the doping of the semiconductor membrane, and as such may be higher than $10^{18}$ cm$^{-3}$, higher than $10^{19}$ cm$^{-3}$ or higher than $10^{20}$ cm$^{-3}$, for example. Doping levels of low doped regions, such as the main substrate layer (i.e the core layer), may be less than $10^{16}$ cm$^{-3}$, less than $10^{16}$ cm$^{-3}$, or less than $10^{14}$ cm$^{-3}$, for example. Low doped regions may be undoped and therefore have no (intentional) added dopants.

Figure 4:
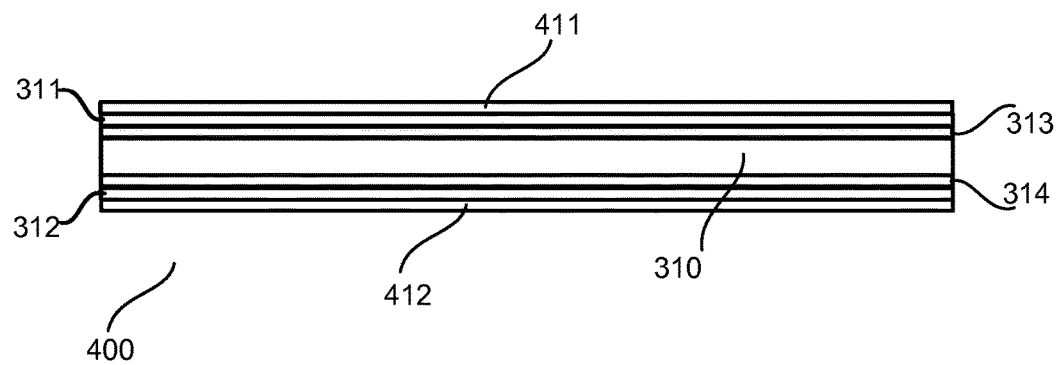
FIG. 4 illustrates an EUV membrane according to a second embodiment of the invention.

FIG. 4 shows an alternative embodiment showing EUV membrane 400 having the same layer structure as EUV membrane 300, but also comprising additional cover layers 411, 412 placed on cover layers 311, 312, as shown in FIG. 4. These additional cover layers 411, 412 may be high doped regions instead of (or in addition to) the cover layers 311, 312. The doping concentrations of the additional cover layers 411, 412 may be any of those mentioned in the previous paragraph.

By doping only the cover layers 311, 312, 411, 412 or intermediate layers 313, 314, rather than the main substrate layer 310, the weakening effects of the doping are mitigated and the overall EUV membrane 300 is stronger as a result.

Figure 5:
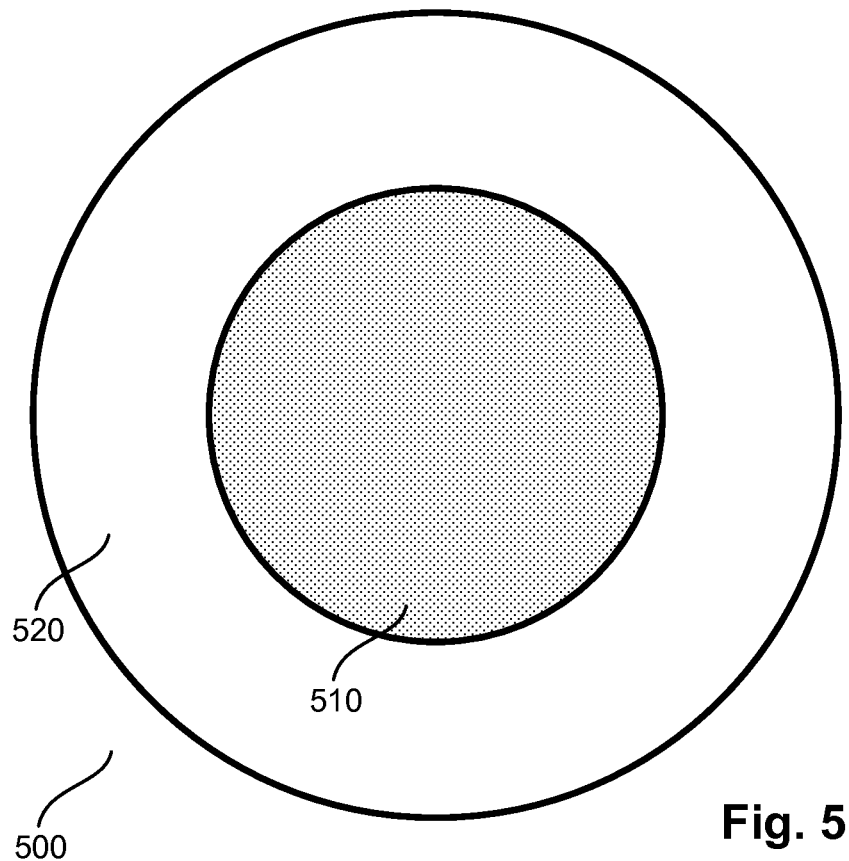
FIG. 5 illustrates an EUV membrane according to a third embodiment of the invention.

FIG. 5 illustrates another embodiment. It shows an EUV membrane 500, which may comprise only a single main substrate layer, or alternatively may comprise cover/intermediate layers, such as layers 311, 312, 313, 314 and possibly also layers 411, 412. In this embodiment, one or more of: the main substrate layer, and (where present) the cover/intermediate layers comprises doping (which may be at the concentrations already described), but where the high doped regions is limited to only a central region 510 of the layer doped. The periphery 520 of this doped layer is a low doped region, where it may be held by a frame. This increases the strength of the EUV membrane 500 at its periphery, which is subject to greater stresses due to holding by the frame. It should be appreciated that the peripheral area 520 transmits little or no EUV, as this is mostly or completely transmitted through the central region 510. Consequently the peripheral area 520 is subject to little heating and its thermal characteristics are less important.

Optionally, the doping can be graded, such that doping increases towards the center. In such arrangements, the gradient may occur over the full radius of the EUV membrane, or layer thereof (i.e. doping starts at the membrane edge and increases towards the center). Alternatively doping may only begin at the edge of the central region 510 and increase towards the center, with the peripheral region 520 having no doping. Or the doping grading may occur for only an intermediate section between a peripheral region having no doping and a central region having high doping.

Using a similar principle to that described in the previous paragraph, doping can be introduced to any layer in the form of spot doping. Spot doping comprises a plurality of high doped (high emissivity) regions, separated by regions of no or low doping (and therefore greater strength). Again, this concept can apply to an EUV membrane 500, comprising only a single main substrate layer, or to EUV membrane 500 comprising additional layers, such as cover layers and/or intermediate layers, in which case the doping can be introduced to any one or more of these layers. In an example, the high doped regions may be separated from one another by approximately 1 μm to 5 μm. It should be appreciated that the heat flux to the highly doped regions is by phonons with comparable or even longer wavelengths than this. Heat is transferred by two mechanisms: radiation (photons) and heat conduction (oscillation of atoms within the lattice, phonons). When the distance between where power is deposited (undoped region) and where power is removed (high doped region) is close, the power is transferred significantly faster; close may be defined as being comparable to wavelength of a phonon with a typical energy (defined by temperature, such a wavelength is in the region of a few microns).

Of course the concepts described in the previous paragraphs may be combined such that the spot doping is confined only to a central region 510 of an EUV membrane, or layer thereof, with no doping in the peripheral region 520. And the doping concentration may be graded such that high doped regions nearer the periphery are less highly doped than those nearer the center. This can help control thermally induced stress and the cooling rate (both of which are a function of dopant concentration). This can also help to control deformations such as wrinkles or folds being formed. When the temperature of the EUV membrane is increased, the material of which it is comprised expands. The flat plane, which is the nominal shape of an EUV membrane, cannot accommodate the expanded material, and folds or wrinkles are formed. EUV radiation absorption by the folds is higher as EUV radiation crosses the EUV membrane at an angle, and thus the effective absorption path is longer. The folds may have a transverse scale of about 10 micrometers or larger (across) and will be imaged on the wafer. Using spot doping, the typical scale of the folds is defined by the geometry and scale of high doped and low doped regions due to the combined effect of temperature profile control and mechanical properties control. Where the temperature increases, the angles of the folds in a spot-doped membrane are the same, but the transverse size is decreased and therefore such folds are no longer imaged.

Previous studies have shown that, for example, photon tunneling and surface polaritons may play a key role in near-field radiative energy transfer when separating distances between radiating objects are smaller than dominant thermal wavelengths. For example, a study by B. Liu et al., Phys. Rev. B 87, 115403, (2013), has demonstrated that near-field radiative heat transfer of some materials can exceed the blackbody radiation limit by few orders of magnitude due to energy transfer through evanescent waves. The studied material supported surface polaritons in the IR region (for example, doped Si materials, SiC, BN or any suitable material that might be used as candidate materials for cover layers 510 and 514).

A graph comparing a near-field radiative heat transfer between two semi-infinite plates made of SiC and gold as function of distance d can also be found in B. Liu et al. (FIG. 1). Distance d represents the vacuum gap size between the two plates. As can be seen in FIG. 1 of B. Liu et al., near-field radiative heat transfer between plates made of SiC and gold is three orders of magnitude less than the heat transfer between two SiC plates.

Consequently, in order to further improve transverse radiative heat transfer along pellicles, in an embodiment it is proposed to provide a plurality of additional features on one of the EUV membrane surfaces. These additional features can be grown or formed during the etching process. The additional features may be of any suitable shape. In one example the additional features comprise periodic or aperiodic wires or thin walls or ribs extending normal from the EUV membrane surface. The additional features may comprise doped Si or Si-based materials or any suitable cover layer material, such as any of the materials, having any of the dopant concentrations and arrangements disclosed herein. The feature size of each additional feature should be significantly smaller than the size of the area bounded by the features. It can be shown that, if the distance between additional features is ≤1 μm, the radiative heat transfer is expected to be 10-10000 times higher than the blackbody limit.

Figure 6:
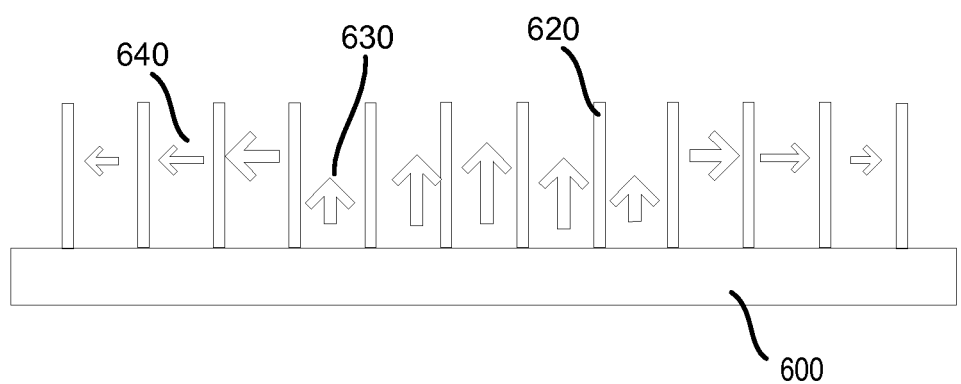
FIG. 6 illustrates an EUV membrane according to a fourth embodiment of the invention.

FIG. 6 shows an EUV membrane 600 comprising a plurality of additional features 620 (e.g. formed by periodic or aperiodic wall or wire structures 620). The additional features 620 may be located on the lower side of the EUV membrane 600 (the side exposed to EUV radiation). The side of the EUV membrane facing the reticle may be flat to maintain purity. Radiative heat transfer is symbolized by vertical arrows 630. Horizontal arrows 640 symbolize a transverse radiative heat transfer generated by the additional features 620. Note that illuminating EUV radiation (not shown) propagates almost normal to pellicle P. Therefore, the additional features 620 (in the form shown here, i.e., wires or ribs) cast a minimal shadow on reticle MA and/or wafer W.

Transverse temperature gradients in the EUV membrane are believed to cause as much damage to the membrane as high temperatures by themselves. While all the embodiments described herein significantly reduce temperature gradients in the EUV membrane during exposure to EUV radiation, the embodiment depicted in FIG. 6 is particularly effective since transverse heat conduction is increased compared to a flat membrane case (where temperature is only transferred by phonons) by adding another mechanism: radiation heat transfer. It is believed that heat transfer from EUV membrane to an additional feature 620 is not limiting, since the typical scale is small. An efficient transverse heat transfer would minimize these temperature gradients and extend lifetime of the pellicle.

Figure 7:
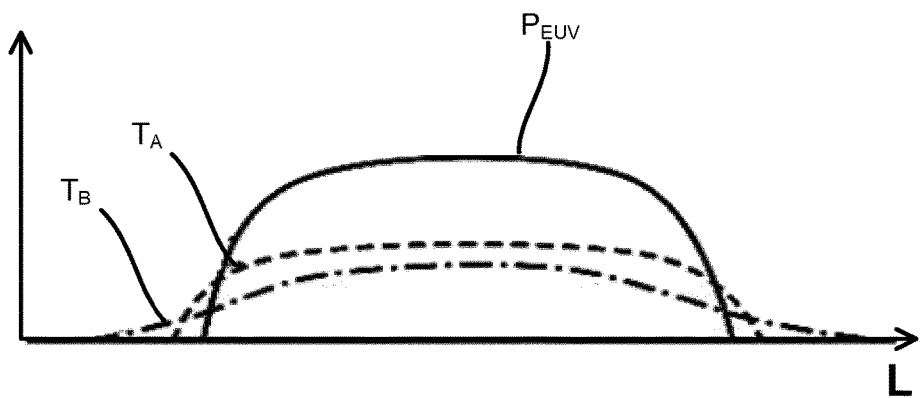
FIG. 7 is a graph of expected temperature distribution against distance L across an EUV membrane, for a flat EUV membrane and for the EUV membrane depicted in FIG. 6.

FIG. 7 is a graph of expected temperature distribution against distance L across the EUV membrane. Line $P_{EUV}$ represents the EUV radiation power distribution across the pellicle. Line $T_A$ represents the temperature distribution of a flat EUV membrane. Line $T_B$ represents the temperature distribution across the EUV membrane depicted in FIG. 6. As can be seen from FIG. 7, temperature gradients across the EUV membrane are reduced for the FIG. 6 example, compared to a flat EUV membrane.

Figure 8:
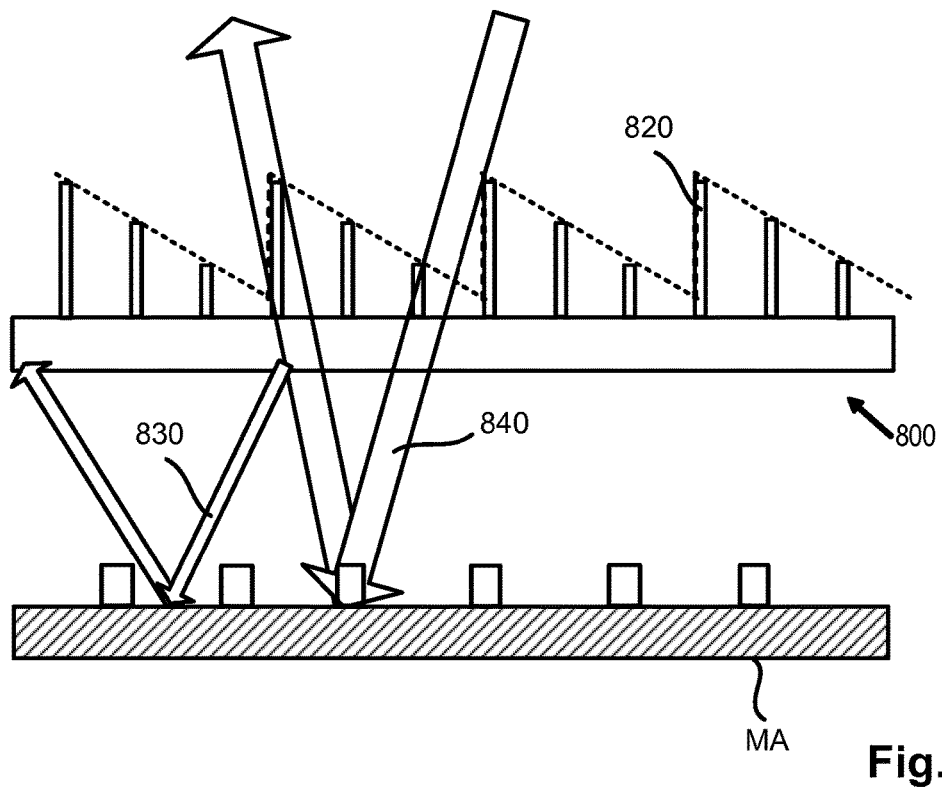
FIG. 8 illustrates an EUV membrane according to a fifth embodiment of the invention.

FIG. 8 shows a further embodiment of an EUV membrane 800, comprising a refinement to the embodiment depicted in FIG. 6. In this embodiment, the additional features 820 comprise a shape and/or formation which mimics that of an echelette grating. In the specific example, the additional features comprise repeated groups of wires or ribs 820, with the individual wires/ribs 820 of each group descending (or increasing) progressively in height as shown. The result is an approximation of an echelette grating, which is illustrated by the dotted line. An echelette grating-like structure helps to direct unwanted radiation 830, originating from scattering of EUV radiation by each wire/rib 820 individually, away from orders (e.g. 0 and $1^{st}$ orders) of the EUV radiation 840 during transfer of a pattern from reticle MA to the wafer.

Figure 9:
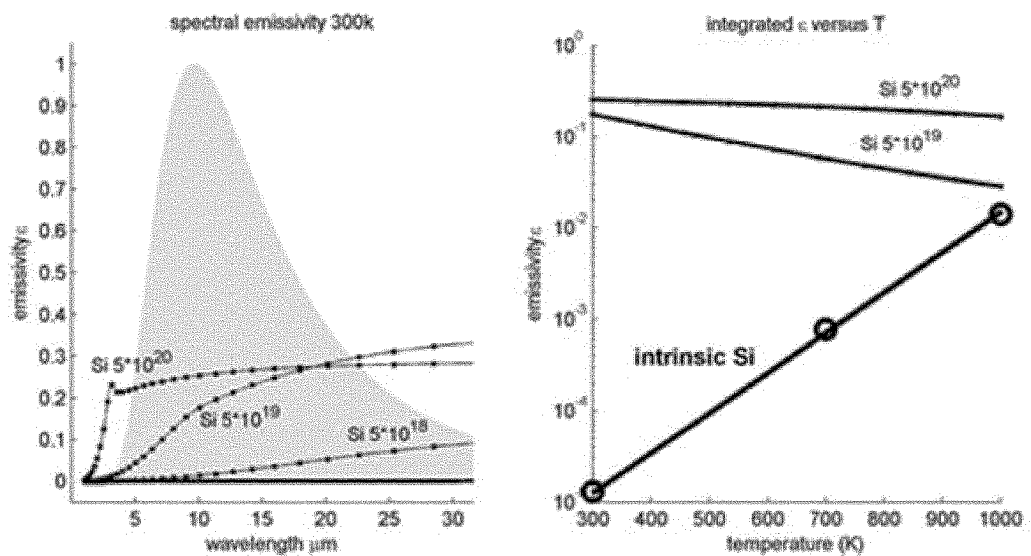
FIG. 9 illustrates the emissivity of a poly-Si EUV membrane as function of temperature for different doping concentrations.

FIG. 9 illustrates the emissivity of doped EUV polysilicon pellicle of 60 nm thickness (left side graph in FIG. 9) and the integrated emissivity versus temperature in K for intrinsic polysilicon pellicle vs doped pellicles (right side graph in FIG. 9). To increase the emissivity above 0.1 a 60 nm polysilicon pellicle was doped with at least $5 \times 10^{19}$ cm$^{-3}$.

In all the above embodiments, doping materials may be limited to those transparent for EUV, and which have the smallest mismatch with Si lattice (e.g. carbon, boron and nitrogen) for the sake of strength and reliability. In other embodiments, dopants which are not transparent for 13.5 nm but are transparent to other EUV/BUV wavelengths can be used, where the wavelength is appropriate for the lithographic system. These dopant materials may include: S, Te, As, O, Al, Sn, Sb, In, Ga, Br, Cl, I, C, B, N.

Although polysilicon has been taken above as main example of an EUV pellicle core layer material (since it is the most transparent material at 13.5 nm EUV radiation), doping of an EUV pellicle material with impurities in order to increased emissivity may be done for any semiconductor. Doping may be done using B or P, which are both transparent materials in the EUV regime. If silicon is doped with B or P also the EUV loss is negligible.

In order to increase an EUV pellicle emissivity to IR radiation while EUV transmission is still substantial, it is herein alternatively or in addition to doping also proposed to coat the EUV pellicle with a cap layer for improved IR emissivity comprising a material which is good absorber for IR radiation but transparent in the EUV radiation regime, for example with a metal cap layer. Such a cap layer may in addition protect the pellicle from oxidation or other environmental hazards.

The metal cap layer should be a closed film, i.e. metal islands are generally not preferred since the resistivity can go up a factor of 10,000 and the Drude absorption term is canceled. Such inhomogeneous films could become transparent and thus provide insufficient absorption.

The EUV pellicle may be chosen to be transmissive for 90% or more of a given EUV radiation wavelength, such as 13.5 nm or 6.8 nm (or any other EUV radiation wavelength). As an example, a polysilicon pellicle of 45 nm thickness coated on both sides with 3 nm Si3N4 has about 85% EUV transmittance, will have a poor (almost no) IR emissivity (i.e. it may get very hot), it reflects much of DUV radiation present in the radiation spectrum (which is not desired for imaging purposes) and will hardly transmit any DUV radiation at all (which results in no option for performing through pellicle inspection to detect particulate debris).

In an aspect of the invention there is provided a membrane transmissive to EUV radiation (i.e. an EUV pellicle) having a core layer material selected from (poly-)Si, Si3N4, SiC, ZrN, ZrB$_2$, ZrC, MoB2, MoC, RuB$_2$, LaB$_2$, LaC, TiB$_2$, TiC, (poly-)crystalline Yttrium, (poly-)crystalline Zr, Be, C, B and B$_4$C and composites or combinations of multilayers therefrom. Semi-metals such as ZrB$_2$, ZrC may reduce the electrostatic charging of the EUV pellicle. Silicon nitride Si3N4 (also referred to as SiNx) refers herein to amorphous silicon nitride and incorporates both stoichiometric (3:4 ratio, x=1.33) and non-stoichiometric SiNx alloys (0<x<1.6).

The EUV pellicle has preferably a thickness of 60 nm or less to allow sufficient EUV transmission (preferably at least 90% EUV radiation transmission). In order to provide sufficient strength to the EUV membrane it may be needed that the core layer has a minimum thickness of at least 5 nm, preferably at least 10 nm and more preferably at least 15 nm minimum thickness.

The EUV pellicle core layer (also referred to as main substrate layer) may be capped on one or both sides with a metal layer or another cap layer (also referred to as cover layer) from a material having a thickness suitable to increase IR emissivity. Examples of suitable cap layer metals that have good EUV transmittance are Ru, Ti, Nd, Pr, Mo, Nb, La, Zr, B, Y and Be. These and other metals may also be used in a similar way to coat the EUV pellicle (more specifically the core layer) and can provide improved IR emissivity. For example a pellicle having a B or Be core layer and being capped with a layer of Ru, Mo or other metal (composite) cap layers may provide a substantially improved IR emissivity.

Metallic thin layers have an emissivity strongly affected by plasma frequency. Metals such as Ru which are less conductive have less free charge carriers and thus lower plasma frequency, being therefore better choice for improved IR emissivity than more conductive metals such as Au or Ag. The highest value for plasma frequency is around 10 eV for Al. Au films have plasma frequency varying from 7 to 9 eV depending on the film quality.

The cap layer may also be a composite material comprising a metal and EUV transparent impurities. By adding non-metallic or poorly conductive EUV transparent impurities the plasma frequency may be tuned to lower values, in which case many metals become good candidates as EUV pellicle cap layers with improved IR emissivity. Examples of poorly conductive impurities are boron, nitrides, carbon, silicon, strontium calcium and phosphorus. By adding impurities and lowering the plasma wavelength, the metal layer thickness may be increased. The impurity concentration in such case is preferably less than 10% atomic percent.

To protect the metal cap layer in the pellicle membrane stack (i.e. in the multilayer stack comprising one or more core (multi-)layers and at least one cap layer for improved IR emissivity), an additional protective cap layer may be included on top of the metal cap layer for improved IR emissivity. This protective cap layer may diminish the effects of oxidation and etching in the EUV plasma environment. Examples of materials suitable for such a protective cap layer may be oxides, carbides or nitrides of the following materials: Zr, Ti, Hf, Si, Rh or Ru (e.g. ZrO$_2$, ZrN, ZrC, etc). The thickness of these protective cap layers is preferably in the order of 1 to 3 nm.

It has been found that metal layers which normally reflect IR radiation become more absorptive when their thickness is less than the skin depth. Metal layers as thin as 1 nm may have a nearly flat spectral response and emissivity close to the theoretical limit of 0.5. A reason for increase in absorption with the decrease of layer thickness may be the large absorption coefficient for metals and reflection canceling due to destructive interference at the metal-vacuum and metal-dielectric interfaces.

In an aspect of the invention there is provided a membrane transmissive to EUV radiation, which is coated with a cap layer for improved IR emissivity comprising a metal cap layer of thickness < the skin depth of a metal in IR radiation. The skin depth thickness of the metal cap layer for IR radiation may generally be <10 nm, although there are metals such as Yttrium (Y) which could still work according to the invention with a thickness a bit larger than 10 nm. Skin depth means herein the thickness where light has lost 63% of its intensity (or has intensity 1/e). The skin depth depends on the light wavelength. Most metals have generally a skin depth of around 10 nm in IR radiation (i.e. IR radiation penetrating a 10 nm metal layer will lose 63% of its intensity).

Thin metal cap layers basically act as IR absorbers, whereas the transmission of the EUV radiation may be substantially the same. For example, it has been determined that a (poly-)silicon pellicle having a core of 58 nm thickness and a layer of 1 nm Ru on each side of the pellicle (since Ru has good EUV transparency), it has for a 13.5 nm EUV radiation a transmittance of 0.878, as compared to the transmittance of 0.9 for a (poly-)silicon pellicle of 60 nm thickness. However, when the EUV pellicle is coated on one or each side for example with 1 to 2 nm Ru cap layer, the emissivity of a (poly-)silicon pellicle may go up by a factor of 10 or more. Ru or other metals on (poly-)Si membranes may enhance a EUV membrane emissivity from <0.01 up to 0.4 or more. However care should be taken, since Ru or Mo with a thicknesses close to $\frac{1}{4}^{th}$ wavelength of the EUV radiation it may reflect around 1% of EUV radiation, which may be detrimental to CD uniformity. Calculations have shown that Ru cap layers with thickness close to 1 nm on EUV membranes may have a reduced EUV reflection and still have some IR emissivity. Also Ru with half wavelength thickness (e.g. 6.7 nm thickness for 13.5 nm EUV radiation) may act as an anti-reflective (AR) coating (with no EUV reflection); however when the Ru cap layer thickness was around $\frac{1}{4}^{th}$ EUV wavelength in such case the EUV reflection had the highest value.

As a strategy to reduce EUV reflection (EUVR) of an EUV membrane coated with a single metal cap layer for improved IR emissivity or any other function, it is proposed herein that the thickness of the metal layer D is a multiple of half wavelength $\lambda$, of the EUV radiation used for lithographic exposure (e.g. 13.5 nm, 6.7 nm or 4.37 nm EUV radiation):

$$D = n\lambda/2 \qquad (1)$$

with n being an integer=3, 4, 5, 6 or more. Preferably n has a value such that the metal cap layer has a thickness smaller than the metal skin depth in IR radiation.

Other AR strategies for low EUVR may be to take a low metal cap layer thickness of 2 nm or less, such as between 1 and 2 nm (i.e. make the IR emissivity enhancing cap layer thin enough so EUV reflection is lower), or to have rough, non-sharp diffuse boundaries.

In the case of even number of metal cap layers for improved emissivity, such as two metal cap layers, the reflectivity of the individual metal layers follows the same rules as for one metal layer. It is herein proposed an EUV membrane in an anti-reflection configuration wherein the two metal cap layers are separated by another core layer of thickness around half of the EUV radiation wavelength $\lambda/2$ used for lithographic exposure, such that destructive interference of EUV radiation occurs canceling each other and thereby the net (resulting) EUV reflection is zero.

For example, if two layers of 2 nm Ru or Mo are separated by a (poly-)Si layer with a thicknesses selected from 8.4 nm, 15.1 nm, 21.9 nm, 28.6 nm, 35.4 nm, 41.5 nm, 48.7 nm and 55.7 nm (i.e. in steps of roughly 6.7 nm), in such case the second Ru cap layer induced reflection interferes destructively with the reflection of the first Ru cap layer and there will be no EUV radiation reflection. It is mentioned that the thickness of the polysilicon core layer is not exactly half of the EUV radiation wavelength of 4.37 nm, or 6.7 nm, or 13.5 nm, as it may also be influenced by the thickness of the metal cap layer. Therefore the general condition for layer thickness in order to avoid EUV reflection for any combination of core layer covered with one or more pairs of metal cap layers is such that completely destructive interference occurs between the metal layers such that no EUV radiation is reflected.

In all the above alternatives for reduced EUV reflection high emissivity can still be maintained due to the metal cap layer, while EUV reflection is minimized (i.e. impact on imaging is minimized), enabling EUV pellicles with high IR emissivity while maintaining low EUV reflectivity.

By itself, even just a core layer of 50 nm (poly-)Si can already suppress DUV radiation by a factor of 100 or more. (Poly-)Si has almost no transmission in the range of 100-400 nm where DUV radiation is expected. (Poly-)Si pellicles are transparent however in the IR radiation range. It has been found that IR transmission through the 50 nm (poly-)Si core layer can be suppressed by a factor of 20, by adding a metal cap layer such as Ru or Mo to the core layer. Furthermore it may be advantageous to use anti-diffusion barrier layers (such as from B4C or SiNx) for the metal cap layers such that the metallic reflection and absorption is not lost due to diffusing into the core layer (e.g. Ru or Mo diffusing in (poly-)Si).

Although a given material may be suitable for multiple purposes, such as for a core layer, a cap layer or even an anti-diffusion barrier layer, the layer thickness and position in the EUV membrane may provide useful criteria to define the function of such a layer. The thickness of an interdiffusion layer for instance is generally 1 nm or less.

For example, a layer of B or B4C having the thickness of 1 nm or less and being located between the core layer and an adjacent cap layer may serve as anti-diffusion layer, while a layer of the same materials having a thickness of 4 to 11 nm may serve as a core layer if it provides high tensile strength in comparison with other layers. In a sandwich-like configuration of 10 nm B-(5-10 nm) Mo-10 nm B for instance the two B layers will form the core layers and Mo in between forms a cap layer for improved IR emissivity which is protected from etching.

In the same way, a layer of B or B4C on the top of the EUV membrane or sandwiched between other (core) layers may serve as a cap layer with a given function. Furthermore, a multilayer stack of thin layers which as a total stack has a high yield strength >50 MPa may also form a core layer. For example, up to 20 pairs of layers of graphene (graphitic layers) between boron, such as 10 nm B/3 nm graphene/10 nm B, may provide an advantageous multilayer EUV membrane since B is expected to be chemically resistant under EUV and/or $H_2$ atmosphere and graphite will provide improved emissivity and mechanical strength. Another example of an multilayer EUV membrane comprises several (up to 20) layers of graphene (or graphitic type layers) on top of SiNx layer or other membrane cap layers to provide mechanical strength, improve emissivity, and increase lifetime of the EUV membrane under EUV and/or $H_2$ atmosphere. For example a multilayer EUV membrane comprising layers of 2 nm graphene (i.e. multilayers or multiple sheets of graphene to achieve a thickness of 2 nm)/10 nm SiNx/2 nm graphene may similarly form an advantageous EUV membrane. The person skilled in the art knows how to differentiate between core and cap layers.

In order for the IR suppression to work it doesn't matter in principle where the metal cap layer is deposited. It may be on top, bottom or in the middle of an EUV membrane multilayer stack (such as a sandwich structure).

emissivity, for which layer thickness the theoretical 13.5 nm EUV transmissivity is about 90%.

TABLE 1

| Er | Ho | Tb | Gd | Ru | Ti | Eu | Sc | Ba | C | Ce | La | Zr | Y | Be |
|---|---|---|---|---|---|---|---|---|---|---|---|---|---|---|
| 4.2e+00 | 4.4e+00 | 5.1e+00 | 6.7e+00 | 6.7e+00 | 8.0e+00 | 9.1e+00 | 1.3e+01 | 1.5e+01 | 1.6e+01 | 1.8e+01 | 2.3e+01 | 3.0e+01 | 5.0e+01 | 7.4e+01 |
| Lu | Dy | V | Yb | Sm | Se | Nd | Li | U | Pr | Mo | Nb | B | Ca | Si | Sr |
| 4.2e+00 | 4.2e+00 | 4.5e+00 | 5.3e+00 | 6.7e+00 | 7.6e+00 | 8.9e+00 | 1.1e+01 | 1.5e+01 | 1.5e+01 | 1.8e+01 | 2.2e+01 | 2.8e+01 | 3.2e+01 | 6.2e+01 | 8.5e+01 |

Because (poly-)Si may etch in the EUV environment, as alternative EUV membrane a sandwhich membrane structure of a molybdenum cap layer between two boron cap layers (B—Mo—B) is proposed above (since Ru is 3× more absorptive for EUV radiation than Mo; and because Mo may oxidize when exposed to ambient). The combination of boron+metal may have equal IR suppression as (poly-)Si+metal, however the DUV suppression is less than for (poly-) Si (a factor 7+ instead of a factor 100+).

EUV transparent metals are for instance Ru, Mo, La, Rh, Be, Y, Zr, Ce, Nb and Pr. Capping layers of boron, B4C, Si3N4, ZrO2, Ru or MoSi2 or other alternative cappings may be advantageous for (poly-)Si SPF membranes.

A metal thicknesses of at least 1 nm, in some conditions in excess of 5 nm may be required for good IR absorption. Too thin metals will have optical response quite different from bulk. IR reflection by metals can therefore be greatly diminished if the metal layer becomes too thin.

In general, any thin metal cap layer with thickness < skin depth of that metal in IR radiation is suitable for an EUV membrane with improved IR emissivity according to the invention. However if the EUV membrane is used as a SPF membrane then it is advantageous if the metal cap layer thickness >5 nm such that it is also quite reflective, such that the metal cap layer applied on a IR transmissive core layer will reduce the IR transmission by an order of magnitude or more. Although the disadvantage of a thicker metal cap layer is more EUV radiation loss (up to 10-15%), there is still a substantial gain in terms of filtering IR and DUV radiation (e.g. 100× or more DUV 100-400 nm suppression and 20× IR (10.6 micron) suppression for (poly-)Si or B core layer with a 5-10 nm metal cap layer.

If an EUV membrane is used as a SPF membrane located between the projection system PS and the wafer, it may also be advantageaus to have a membrane configuration oriented under a small angle in the scan direction of the lithographic apparatus, such that the reflected out-of-band, IR and DUV radiation are not reflected back into the projection system PS of the lithographic apparatus. Also, an absorption screen may be needed on one or more of the EUV mirrors of the projection system PS in order to protect them from the additional DUV and IR absorption and back reflection.

The thickness of the cap layer for optimal IR absorption (i.e. improved IR emissivity) may be in a different range than exemplified above for Ru, depending on the cap layer material. However, for allowing a substantive EUV transmission it is generally advantageous to keep the thickness of the cap layers as small as possible. The thickness of all the cap layer(s) stacked on the EUV pellicle should preferably be 90 nm or less, preferably 50 nm or less, more preferably 20 nm or less, even more preferably 10 nm or less (about the metal skin depth in IR radiation) and most preferably 5 nm or less, depending on the choice of materials.

Table 1 shows examples of the thickness (in nm) of the above listed materials for a cap layer with improved IR If two cap layers for improved IR emissivity are used (e.g. one for each side of the EUV pellicle) then the thickness of each cap layer may be taken as half of the optimal cap layer thickness in order to still keep a good EUV transmission. In similar way, if several (three or more) cap layers for improved IR emissivity are used the individual and total thickness of the cap layers will have to be adjusted such that a good EUV transmission is still kept Above is referred to cap layers, however the materials listed in table 1 may also form the core layer of the EUV pellicle, as long as suitable mechanical strength can be achieved to manufacture a self-standing pellicle.

Also oxidation is a concern for many of these cap layer materials. Using nitrides (for example ZrN (13 nm) or LaN (10 nm)) may help against oxidation although a nitride may introduces more EUV loss. Ru coating layer(s) having each a thickness in a range from 0.5 to 5 nm, preferably from 1 to 3 nm, more preferably from 1 to 2 nm is therefore one of the preferred choices to improve the EUV pellicle emissivity in IR radiation.

Ru is given herein as an example because it has good anti-oxidation properties (for a protective cap layer) and good EUV transmittance. Herein a new function is proposed for Ru as material for IR emissivity enhancing cap layer. IR emissivity enhancement may however be obtained with any metal cap layer (e.g. also gold or silver), but the EUV transmittance may become worse. The inventors have found several materials exemplified herein which are both substantially EUV transparent and have a Drude behavior of electrical conduction (wherein electrons act as free charge carriers bouncing and re-bouncing off heavier, relatively immobile positive ions).

Another example of an EUV pellicle is a carbon-based material for pellicle core having for example a thickness of 4 to 7 nm. By carbon-based material herein is meant any carbon structures in various allotrope forms, also including carbon nanostructures in form of a ball, tube (cylinder) or sheet. Examples of carbon-based materials are carbon nanotubes, graphene, graphite, diamond-like carbon (DLC), (Buckminster-)fullerene or other C structures. Herein carbon-based materials are for simplicity also referred to as carbon.

EUV pellicles having a core layer from a carbon-based material may also function well for an EUV radiation of 4.37 nm wavelength. Such EUV pellicles may have relatively low IR emissivity. Coating the pellicle core with thin metal cap layers such as Ru, Pd, Ag, Ti, Mo, Zr or Nb layers will not hinder EUV transmission much, but it will significantly enhance the IR emissivity.

A pellicle having a SiNx core (11-12 nm) capped with a 2 nm Ru cap layer gives about 90% transmission and can withstand high EUV power. Ru coating on both sides of the SiNx pellicle may lead to about 4% additional loss. Such membranes show a significant absorption in the VIS and NIR range. For example, for heat load testing done with pulsed 90 Watt (λ=355 nm) and 60 Watt (λ=810 nm) lasers on a 1 cm² area of a 13 nm thick Si3N4 membrane, covered on each side with a Ru layer of 2 nm, which membrane had around 85% EUV transmission, the heat load testing results showed that such membrane could survive a heat load of 170 Watt for over 200.000 laser shots without significant change in the EUV transmission (EUVT).

A pellicle having a B4C or boron (B) core (20 nm) capped with 2 nm Ru cap layer gives about 90% EUV transmission. A boron based EUV pellicle (core) has a self-limiting oxide (since oxide does not diffuse very easily in boron). Boron is also very etch-resistant and we can work also with only one layer of Ruthenium (Ru). Reversely, also a Ru layer as cap layer for improved IR emissivity may be embedded between two B core layers.

Generally speaking, when IR emissivity is increased (in any way) from below 0.1 to about 0.5 the pellicle temperature can decrease from about 800 degrees to 400 degrees Celsius. This will lower the heat induced stresses in the pellicle core membrane and therefore increase lifetime of the pellicle at higher EUV source powers. Advantages of such measures may be one or more of the following: at least 10× higher emissivity/radiative cooling for pellicles, much cooler pellicles during exposure, and pellicles that survive higher heat loads (i.e. higher EUV source powers).

Figure 10:
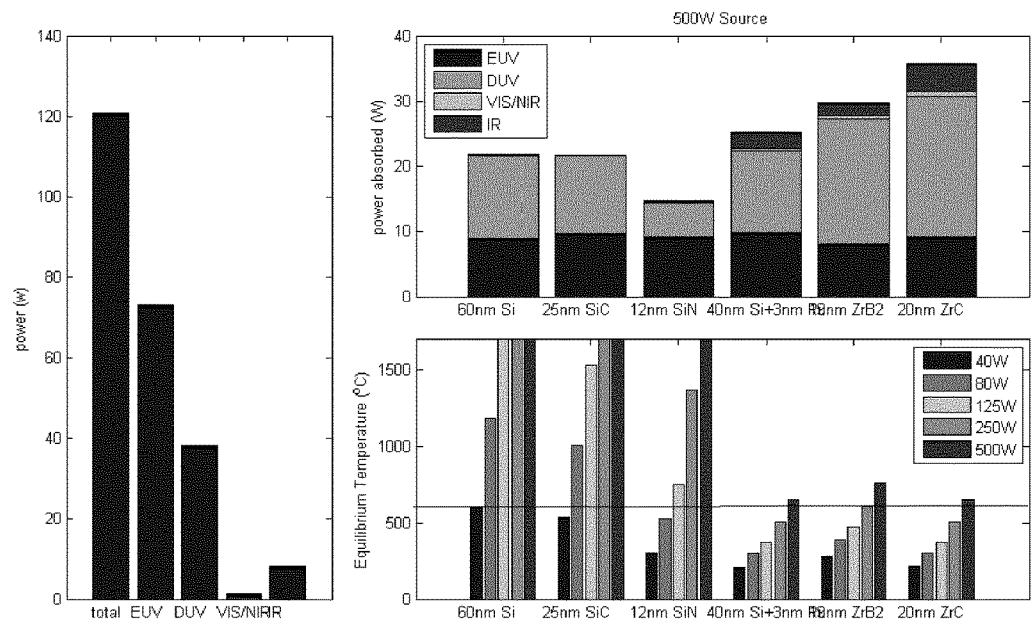
FIG. 10 illustrates a comparison of EUV membrane power absorption and maximum temperature vs EUV source power.

FIG. 10 compares the EUV pellicle power absorption and maximum temperature versus EUV source power. When a (poly-)Si membrane might survive around 40 W source power, a (poly-)Si pellicle having a Ru coating for improved IR emissivity can enhance the power absorption to 500 W source power such that the EUV pellicle remains intact. FIG. 10 shows the absorbed power and equilibrium temperature (in ° C.) for EUV pellicles of 60 nm Si, 25 nm SiC, 12 nm Si3N4, 40 nm Si+3 nm Ru, 19 nm ZrB2 and 20 nm ZrC.

Figure 11:
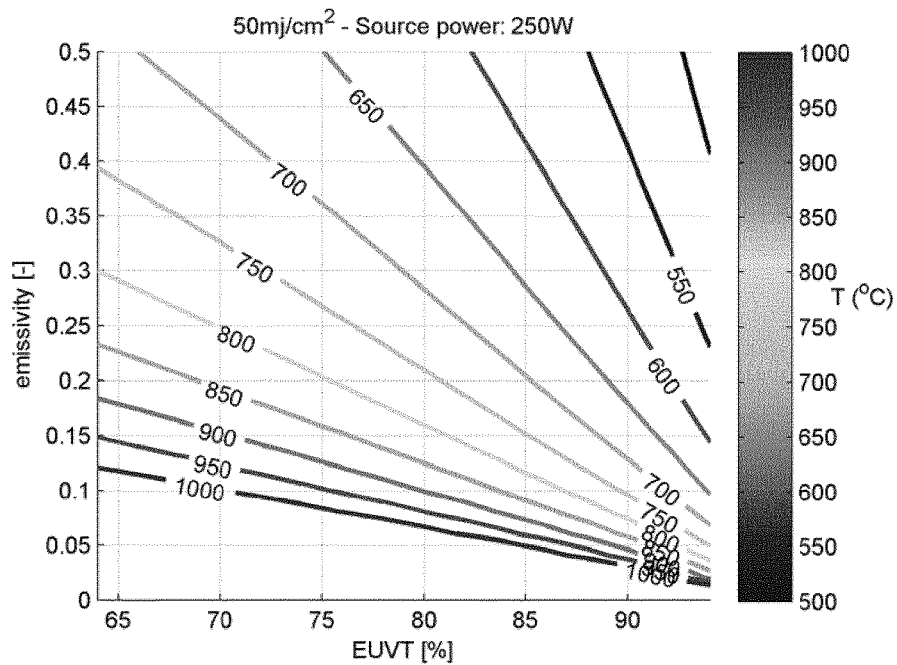
FIG. 11 shows the effect of IR emissivity on EUV membrane temperature.

FIG. 11 shows the equilibrium temperature vs. EUV radiation transmission (EUVT) and emissivity for 50 mj/cm2 power equivalent to EUV source power of 250 W. With a 250 Watt source and a pellicle with 90% transmission may absorb about 1 Wcm$^{-2}$ EUV radiation, which is re-emitted at the equilibrium temperature. Emissivity below 1% in the case of polysilicon films results in temperatures of over 1000° C. and pellicle failure. Ru coated pellicles with emissivity of 0.4 can reduce this temperature for example to a more manageable temperature around 600° C.

Also a silicide cap layer may be effective in increasing IR emissivity, such as ZrSi2 or NbSi2 as IR-emitting cap layers. They may be covered with a protective cap layer of ZrO2 and Nb2O5, respectively. Silicides may be even better than Ru with respect to transmission of EUV radiation. For example a combination of ZrSi2/ZrO2 cap layers may have a higher transmission for EUV radiation than a stack of NbSi2/Nb2O5 cap layers.

Examples of suitable materials for high temperature resistant pellicles at 13.5 nm EUV radiation are ZrB2, ZrC, MoB2, MoC, RuB2 and SiC.

Examples of suitable materials for high temperature resistant pellicles at 6.7 nm EUV radiation are ZrB2, ZrC, LaB2, LaC, TiB2, TiC MoB2 and MoC. For 4.37 nm EUV radiation a suitable material is for example TiC.

If the cap layer for improved IR emissivity is located on the top of the core layer, such that it comes in direct contact with external degrading factors (e.g. H radicals, EUV radiation etc.), then relatively fast failure of the cap layer/EUV pellicle could arise due to the high pellicle temperature during EUV exposure. In an embodiment it is proposed to sandwich a cap layer for improved IR emissivity between two chemically resistant core layers (such as between two boron, carbon or B4C layers) to avoid degrading. The cap layer preferably is a metal layer. Examples of configurations (and suitable thickness ranges) tuned for at least 90% transmission in a Boron or B4C (5-10 nm)-metal (1-10 nm)-Boron or B4C (5-10 nm) configuration are:

Boron (B4C) 11 nm-Mo 5 nm-Boron (B4C) 11 nm;
Boron (B4C) 11 nm-Y 10 nm-Boron (B4C) 11 nm; and
Boron (B4C) 10 nm-Ru 3 nm-Boron (B4C) 10 nm.

When the core layer in the EUV pellicle sandwich structure is boron or B4C, suitable metal cap layer materials for improved (enhanced) IR emissivity for EUV wavelength of 6.7 nm are for example Nb, Mo, La, Zr, In, Ti, Ru, Te, Bi, Ce, Pd, Ag and Y.

When the core layer in the sandwich structure is carbon or a carbon-based material (e.g. carbon-metal-carbon), then suitable metal cap layer materials for improved (enhanced) IR emissivity for EUV wavelength of 4.37 nm are for example Be, La, Te, Ti, Pr, Rh, Eu, In, Ru, V, Pd, Al, Ru and Ag.

Interestingly, it has also been found that EUV pellicles having a boron core layer can be made much thicker for pellicles tuned for EUV wavelength of 6.7 nm. For example a 140 nm thick boron core layer provides in itself around 90% EUV transmission without no need of further cap layers for improved IR emissivity.

(Poly-)Si based pellicles which have been tuned via appropriate material and membrane thickness choice to have a good EUV transmission (≥85%) may have an additional disadvantage that they reflect much of the DUV radiation potentially present in the exposure radiation spectrum and do not transmit DUV (i.e. they have high DUV reflectance and poor DUV transmittance). They may also suffer from poor IR emissivity, although the latter can be mitigated as described above for instance by adding a cap layer for improved IR emissivity such as 1 to 2 nm Ru cap layer on top of the pellicle core layer. Such Ru cap layer does not improve (or worsen) however the DUV reflectance and transmittance.

Besides lowering the DUV reflectance desired for better imaging, a higher DUV transmittance can help to further lower the DUV radiation impact at wafer level during EUV exposure, while also allowing DUV mask inspection.

Through pellicle inspection and high pellicle DUV reflection of EUV pellicles may be mitigated with a series of materials as shown below, which materials mitigate DUV reflection and in the same time enhance DUV transmission at 157, 193 or 248 nm which are suitable wavelengths for known mask inspection tools.

Several materials which allow for ArF, KrF and F2 mask inspection tools and less image degrading DUV at wafer are exemplified below:

Crystalline Yttrium has good 193 nm transmittance and low DUV reflectance (Poly-)crystalline Zr (e.g. ZrN and ZrC) and (poly-)crystalline Y all have low DUV reflectance.

Amorphous and graphitic Carbon based pellicles may have good 157 and 193 nm transmittance and low DUV reflectance Si3N4 pellicles may allow for 248 nm mask inspection at a still low DUV reflectance.

All the above EUV pellicles also have good IR emissivity of more than 0.2

It has been determined that crystalline Yttrium has a transmission peak at 193 nm and also has high IR emissivity. For example, a 20 nm thick yttrium core EUV pellicle covered on both sides with 1 nm Ru cap layer has (in brackets a comparison is given with a Si+Ru equivalent pellicle):

DUV 193 nm transmittance of 67% (double pass 43%) (versus 0% for Si+Ru)
DUV reflectance 100-250 nm<12% (versus 20-50% for Si+Ru)
DUV reflectance 250-400 nm<25% (versus >60% for Si+Ru)
EUV transmittance of 92.5% (versus 85% for Si+Ru)

Yttrium pellicles can be up to 50 nm thick for 90% EUV transmittance. Ru cap layers applied on both sides of the EUV pellicle will limit this upper thickness to about 36 nm. The thicker the yttrium core, the more of 193 nm DUV radiation is lost.

It should be noted that to the present no other material with such high 13.5 and 193 nm transmission has been found such as crystalline Yttrium, which is a unique material in this respect.

Polycrystalline Yttrium does not have high 193 nm transmission. However both Zr-based and Y-based EUV pellicles have much lower DUV reflection than (poly-)Si. In fact, if for any reasons low DUV reflection is a requirement then (poly-)Si based pellicles may not be advantageous. If 193 nm transmittance and through pellicle inspection are not needed, then polycrystalline Zirconium or Yttrium based pellicles with Ru cap layer(s) may also lower the DUV reflectance to much lower values than for (poly-)Si.

ZrN and ZrC may also have lower DUV reflectance than (poly-)Si. DUV transmission of ZrN and ZrC is less than for Zr or Y, making however through pellicle inspection more difficult.

Crystalline, amorphous and graphitic carbon or carbon-based material have a DUV transmission peak at 157 and also high IR emissivity. Graphitic carbon is similar to multilayer graphene.

The reflectivity of MoSi multilayer mirrors is highest around 200-300 nm. In this range DUV is best reflected to wafer (almost as good as EUV). All EUV pellicles described herein significantly reduce reflection in this wavelength range. On the other hand (poly-)Si, SiC and (poly-)Si+Ru based pellicles are a worse choice for DUV reflection and transmission. SiNx based pellicles may have better reflectivity above 200 nm if the SiNx core is thin enough (e.g. 13 nm or less).

Figure 12:
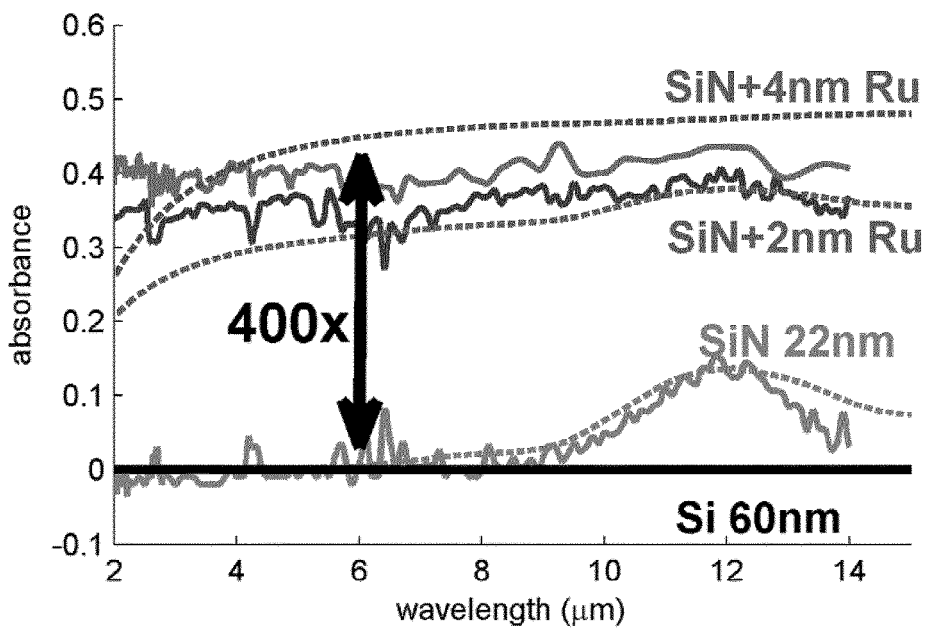
FIG. 12 shows the effect of Ru cap layer for improved IR emissivity compared with a (poly-)Si EUV membrane.

FIG. 12 compares the response of Si3N4 pellicles with Ru cap versus Si pellicles with Ru cap (see FIG. 12 showing the absorbance vs wavelength, wherein theoretical data (dashed lines) are compared to experimental results (solid lines)). Experiments with FTIR showed that Ru layers of just 2 nm with 3% EUV loss could enhance emissivity 400 fold from about 0.001 to 0.4. Therefore a few nm Ru thick layer may enhance absorption/emissivity of a SiNx or Si membrane over 100 fold. The Si3N4 pellicles (22 nm) were much thinner than the Si pellicles (60 nm) to ensure sufficient EUV transmittance. It was found that Si3N4 based pellicles have much lower DUV reflection and good DUV transmission around 250 nm. Si3N4 pellicles with 1-2 nm Ru cap layer reflect also much less DUV radiation than Si+Ru pellicles, therefore it was found that pellicles based on Si3N4+Ru cap layer could allow through pellicle 248 nm KRF mask inspection.

Ru or other metal coatings are in principle not needed to enhance emissivity for Zr and Y or graphitic/amorphous carbons. They may be used however as protective cap layers to prevent for example oxidation. Any other suitable (non-metal) protective cap layer that can prevent oxidation of Zr and Y will also work well. Ru or other metal cap layers are preferably applied in case of Si3N4 and (poly-)Si for the purpose of enhancing the IR emissivity.

Below there are some characteristics obtained by simulations given for several pellicles which have a good balance of emissivity, transmission and absorption of EUV (13.5 nm), IR and DUV radiation:

EXAMPLE 1

Ru Coated Crystalline Yttrium Based Pellicles:

have 90% EUV transmittance up to 35 nm thick
have 70%193 nm transmittance (193 nm inspection is a possibility)
Have 2-5× lower DUV reflection than Si
Have emissivity close to 0.25

EXAMPLE 2

Ru Coated Polycrystalline Yttrium or Zirconium Based Pellicles have 90% EUV transmittance up to 25 nm thick (Zr) and 35 nm thick (Y)
Have 10%193 nm transmittance (193 nm inspection not possible on Zr or Y pellicle)
Have 40% 248 nm transmittance (248 nm inspection may work in case of Zr)
Have 2-3× lower DUV reflection than Si
Have emissivity close to 0.25
ZrC and ZrN based pellicles can also reduce DUV reflection by up to factor of 2-8

Example 3

Ru Coated Si3N4 (SiNx) Pellicles (10 nm Si3N4 (SiNx)+2 nm Ru)

have 90% EUV transmittance up to 10 nm thick (2 nm Ru)
Have 25%193 nm transmittance
Have 70% 248 nm transmittance (248 nm inspection might work)
Have up to 10× lower DUV reflectance in range 200-400 nm
Have emissivity up to 0.5

Example 4

Amorphous and Graphitic Carbon (or Multilayer Graphene)

have 90% EUV transmittance up to 16 nm thick
Have 60-80% 157 nm transmittance (157 nm inspection is a possibility)
Have 40-70% 193 nm transmittance (193 nm inspection is a possibility)
Have 2-10× lower DUV reflectance
Have emissivity 0.15-0.4

Figure 13:
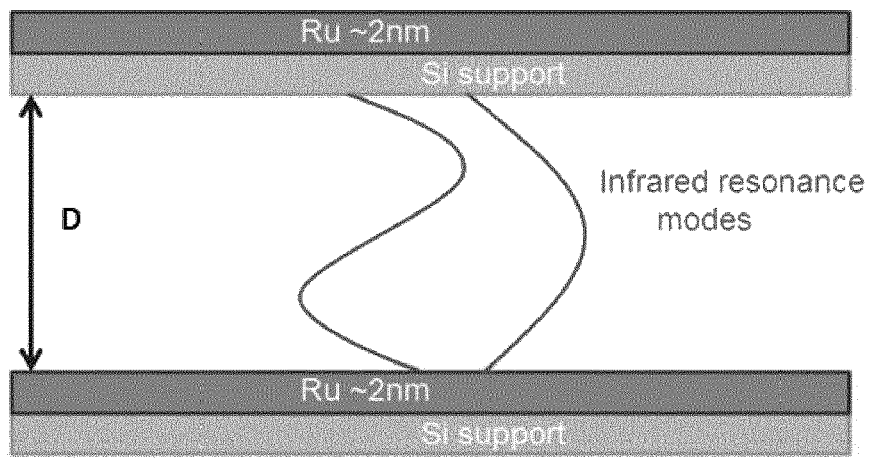
FIG. 13 illustrates a dual EUV pellicle (i.e. a membrane assembly) which enhances IR emissivity due to resonant absorption.

FIG. 13 shows schematically another embodiment according to the invention being a membrane assembly of two membranes transmissive to EUV radiation separated by a gap of thickness D, also referred to as a dual membrane or dual EUV pellicle. Such a dual pellicle comprises two or more EUV membranes of a material for improved IR emissivity as exemplified herein, for example two metal layers with a thickness less than the metal skin layer thickness of IR radiation. In such a dual EUV pellicle each individual metal layer is preferably chosen such that there is no EUV radiation reflection, since destructive interference cannot be easily controlled for large distances.

FIG. 13 shows an embodiment where the layers for improved IR emissivity are Ru or Mo layers having a layer thickness D of 1-2 nm. The improved IR emissivity layers of the dual pellicle may optionally each be supported by another support layer, such as a Si support layer, to provide more mechanical strength. The EUV membranes are separated by a gap D of 1-10 microns, preferable D is about 1-2 microns gap. Also a multiple membrane comprising alternating layers of metals and corresponding gaps in the required thickness range are possible. The advantage of having a gap with the above mentioned thickness D between the EUV membranes (e.g. metal layers of thickness < metal skin layer thickness) is inducing IR resonance modes between the EUV membranes, which further enhance the IR emissivity of the membrane assembly. Another example of a dual EUV pellicle is 2×10 nm ZrC or $ZrB_2$ separated by 2 microns gap. Compared to 1×20 nm ZrC pellicle, the emissivity will be increased from 0.45 to 0.7 (close to the theoretical limit of 1).

Typically the optimal emissivity of a pellicle obtained by doping (poly-)silicon or another semiconductor material is similar to that of a pellicle coated with very thin layer of metal. Both cases may give up to about 10× enhancement of IR emissivity. For example in the case of doping the maximum spectrally integrated IR emissivity obtained was found to be about 0.4, whereas in the case of applying a Ru cap layer of 1 nm thickness, the maximum spectrally integrated IR emissivity obtained was found to be about 0.5.

In summary, this disclosure provides simple and robust examples for increasing EUV membrane performance, and therefore performance of EUV pellicles and SPFs. EUV membrane temperatures, and temperature gradients across the EUV membrane, are reduced. As a consequence the lifetime of the EUV membrane and tolerance to EUV radiation power is improved. Additionally, high EUV membrane robustness is achieved without decreasing EUV radiation intensities (deteriorating the manufacturing system performance).

Embodiments are provided in accordance with the following clauses:
1. A membrane transmissive to EUV radiation, comprising:
   one or more high doped regions where the membrane is doped with a high dopant concentration; and
   one or more low doped regions where the membrane has no doping or a low dopant concentration,
   wherein a high dopant concentration is defined as dopant concentration greater than $10^{17}$ cm$^{-3}$ and a low dopant concentration is defined as a dopant concentration less than $10^{17}$ cm$^{-3}$.
2. A membrane according to clause 1, comprising a plurality of layers which include a main substrate and one or more additional layers, wherein the main substrate has a low dopant concentration and forms a low doped region; and the high doped regions are comprised within some or all of the additional layers.
3. A membrane according to clause 2, wherein the additional layers comprise one or more cover layers for the protection of the membrane from etching or reacting agents, and the doped regions are comprised within the cover layers.
4. A membrane according to clause 2, wherein the additional layers comprise one or more cover layers and one or more intermediate layers, arranged such that an intermediate layer is located between a cover layer and the main substrate; the cover layers being for the protection of the membrane from etching or reacting agents material, and the intermediate layers having an intermediate lattice size between that of the main substrate and the cover layer so as to reduce stress within the membrane; and wherein the high doped regions are comprised within the cover layers and/or the intermediate layers.
5. A membrane according to clause 2, clause 3 or clause 4, wherein the main substrate is comprised of a poly-Si material.
6. A membrane according to any preceding clause, wherein the membrane, or a layer thereof, comprises a central region and a peripheral region around the central region, wherein the high doped region comprises the central region and the low doped region comprises the peripheral region.
7. A membrane according to any preceding clause, wherein the membrane, or a layer thereof, comprises a plurality of the high doped regions separated by the low doped regions.
8. A membrane according to clause 7, wherein the separation between adjacent high doped regions is between 1 µm and 5 µm.
9. A membrane according to any preceding clause, wherein the doping concentration is graded, and increases towards the center of the membrane, or a layer thereof.
10. A membrane according to any preceding clause, wherein the high doped regions are doped with a dopant concentration greater than $10^{18}$ cm$^{-3}$.
11. A membrane according to any of clauses 1 to 9, wherein the high doped regions are doped with a dopant concentration greater than $10^{19}$ cm$^{-3}$.
12. A membrane according to any of clauses 1 to 9, wherein the high doped regions are doped with a dopant concentration greater than $10^{20}$ cm$^{-3}$.
13. A membrane according to any preceding clause, wherein the low doped regions are doped with a dopant concentration less than $10^{16}$ cm$^{-3}$.
14. A membrane according to any of clauses 1 to 12, wherein the low doped regions are doped with a dopant concentration less than $10^{15}$ cm$^{-3}$
15. A membrane according to any of clauses 1 to 12, wherein the low doped regions are doped with a dopant concentration less than $10^{14}$ cm$^{-3}$.
16. A membrane according to any preceding clause, wherein the membrane has a thickness less than 100 nm.
17. A membrane according to any preceding clause, comprising a plurality of additional features on one or both surfaces of the membrane which are operable to increase transverse heat transfer.
18. A membrane according to clause 17, wherein the additional features comprise ribs or wires extending normal from the membrane surface.
19. A membrane according to clause 17 or clause 18, wherein the distance between additional features is ≤1 µm.
20. A membrane according to clause 17, clause 18 or clause 19, wherein the additional features are configured to resemble an echelette grating.
21. A membrane according to clause 20, wherein the additional features comprise repetitive groups of wires or ribs, with each group comprising wires/ribs progressively descending or increasing in height.
22. A membrane according to clause 6, clause 7 or clause 8, comprising only a single layer.

23. A membrane according to any preceding clause, wherein the high doped regions are doped with a dopant material comprising one or more of: S, Te, As, O, Al, Sn, Sb, In, Ga, Br, Cl, I, C, B and N.

24. A membrane according to any preceding clause, wherein the dopant is selected for N-type doping and the high dopant concentration comprises from $(2 \text{ to } 3) \times 10^{20}$ n/cm$^3$ donor atoms.

25. A membrane according to any preceding clause, wherein the dopant is selected for P-type doping and the high dopant concentration is at least $4 \times 10^{20}$ n/cm$^3$ acceptor atoms.

26. A membrane for a lithographic apparatus having IR radiation emissivity of at least 0.1 and being substantially transmissive to EUV radiation, comprising a core layer of thickness 60 nm or less, the core layer comprising a material substantially transparent for EUV radiation selected from the list of from (poly-)Si, $Si_3N_4$, SiC, ZrN, $ZrB_2$, ZrC, $MoB_2$, MoC, $RuB_2$, $LaB_2$, LaC, $TiB_2$, TiC, (poly-)crystalline Yttrium, (poly-)crystalline Zr, Be, C, B and $B_4C$, and a cap layer for improved IR emissivity comprising a material which absorbs IR radiation and having a layer thickness of 20 nm or less.

27. A membrane according to clause 26, wherein the membrane has a cap layer—core layer—cap layer sandwich-like configuration.

28. A membrane according to clause 26, wherein the membrane has a core layer—cap layer—core layer sandwich-like configuration.

29. A membrane according to any of clauses 26 to 28, further comprising one or more other intermediate layers or cap layers.

30. A membrane according to any of clauses 26 to 29, wherein the core layer is a multilayer stack comprising one or more layers of (poly-)Si, $Si_3N_4$, SiC, ZrN, $ZrB_2$, ZrC, $MoB_2$, MoC, $RuB_2$, $LaB_2$, LaC, $TiB_2$, TIC, (poly-)crystalline Yttrium, (poly-)crystalline Zr, Be, C, B and $B_4C$.

31. A membrane according to any of clauses 26 to 29, wherein the core layer material is a composite material comprising a metal and non-metallic EUV transparent impurities dispersed therein.

32. A membrane according to any of clauses 26 to 31, wherein the cap layer for improved IR emissivity is a metal layer.

33. A membrane according to clause 32, wherein metal cap layer has a thickness which is less than the skin depth of the metal in IR radiation. 34. A membrane according to clause 33, wherein metal cap layer has a thickness $D = n\lambda/2$, with n being an integer equal to 3 or more and $\lambda$ being a wavelength of the EUV radiation used for lithographic exposure.

35. A membrane according to clause 26, wherein the EUV membrane comprises two metal cap layers for improved IR emissivity separated by a core layer, the cap and core layers being arranged such that destructive interference of EUV radiation occurs on the two metal cap layers and thereby the resulting EUV reflection is zero.

36. A membrane according to clause 35, wherein the each metal cap layer comprise a 2 nm thick layer of Ru or Mo, and wherein the core layer comprises a (poly-)silicon layer of thicknesses selected from 8.4 nm, 15.1 nm, 21.9 nm, 28.6 nm, 35.4 nm, 41.5 nm, 48.7 nm and 55.7 nm.

37. A membrane according to any of clauses 33 to 36, wherein the skin depth of the metal in IR radiation is about 10 nm.

38. A membrane according to any of clauses 26 to 37, wherein the material of the cap layer for improved IR emissivity comprises a metal selected from Ru, Ti, Nd, Pr, Mo, Nb, La, Zr, B, Y and Be, wherein the cap layer is of a different material than the core layer.

39. A membrane according to any of clauses 26 to 37, wherein the material of the cap layer for improved IR emissivity comprises $B_4C$, $SiN_x$, $ZrO_2$ or $MoSi_2$ and is of a different material than the core layer.

40. A membrane according to any of clauses 26 to 37, wherein the material of the cap layer for improved IR emissivity is a silicide different than the core layer, such as ZrSi2 or NbSi2.

41. A membrane according to any of clauses 28 to 40, wherein the core layer comprises (poly-)Si and the cap layer for improved IR emissivity is a Mo or Ru layer of thickness 5 nm or less.

42. A membrane according to any of clauses 26 to 37, wherein the core layer comprises (poly-)Si and the cap layer for improved IR emissivity comprises at least one of Ti, Nd, Pr, Nb, La, Zr, B, Y, Be, ZrO2, $MoSi_2$, $ZrSi_2$ and $NbSi_2$.

43. A membrane according to any of clauses 26 to 40, wherein the core layer comprises B, $B_4C$ or Be and has a thickness of 25 nm or less.

44. A membrane according to clause 43, wherein the cap layer for improved IR emissivity is a metal layer of thickness of 1 -10 nm.

45. A membrane according to clause 26, wherein the core layer is a multilayer core comprising up to 20 pairs of B or $B_4C$ and graphene, wherein the layer thickness ratio is . 10 nm B or $B_4C$/3 nm graphene.

46. A membrane according to clause 26, wherein the core layer is a multilayer core comprising up to 20 pairs of SiNx and graphene, wherein the layer thickness ratio is 10 nm SiNx/2 nm graphene.

47. A membrane according to clause 43 or 44, wherein the core layer is a B or $B_4C$ layer of thickness 5-15 nm and wherein the cap layer for improved IR emissivity is a (poly-)crystalline Y, Ru or Mo layer with thickness of 1-3 nm.

48. A membrane according to any of clauses 26 to 40, wherein the core layer has a thickness of 16 nm or less and comprises a carbon-based material.

49. A membrane according to clause 48, wherein the carbon-based material is a crystalline, amorphous or graphitic carbon layer.

50. A membrane according to clause 48 or 49, wherein the cap layer comprises a metal selected from Be, La, Te, Ti, Pr, Rh, Eu, In, Ru, V, Pd, Al. Mo, Zr, Nb and Ag.

51. A membrane according to any of clauses 26 to 40, wherein the core layer comprises silicon nitride and has a thickness of 15 nm or less.

52. A membrane according to clause 51, wherein the cap layer for improved IR emissivity is a Ru or Mo layer of thickness 3 nm or less.

53. A membrane according to any of clauses 26 to 40, wherein the core layer comprises (poly-)crystalline yttrium and has a thickness of 50 nm or less, preferably 35 nm or less.

54. A membrane according to any of clauses 26 to 40, wherein the core layer comprises polycrystalline Zr and has a thickness of 25 nm or less.

55. A membrane according to clauses 53 or 54, wherein the cap layer for improved IR emissivity is a Ru layer.

56. A membrane according to any of clauses 26 to 55, wherein the cap layer for improved IR emissivity is protected with a protective cap layer from a material protecting against oxidation and/or etching selected from oxides, carbides or nitrides of the following materials: Zr, Ti, Hf, Si, Rh and Ru.
57. A membrane according to clause 56, wherein the protective cap layer has a thickness from 1 to 3 nm.
58. A membrane according to any of clauses 26 to 40, wherein the membrane is transmissive for EUV radiation having the wavelength of 13.5 nm, and wherein the core layer comprises at least one of $ZrB_2$, $ZrC$, $MoB_2$, $MoC$, $RuB_2$ or $SiC$.
59. A membrane according to any of clauses 26 to 40, wherein the membrane is transmissive for EUV radiation having the wavelength of 6.7 nm, and wherein the core layer comprises at least one of $ZrB_2$, $ZrC$, $LaB_2$, $LaC$, $TiB_2$, $TiC$, $MoB_2$ or $MoC$.
60. A membrane according to any of clauses 26 to 40, wherein the membrane is transmissive for EUV radiation having the wavelength of 4.37 nm, and wherein the core layer comprises TiC.
61. A membrane for a lithographic apparatus having IR radiation emissivity of at least 0.1 and being substantially transmissive to EUV radiation of 6.7 nm wavelength, the membrane comprising a core layer from a material comprising boron, wherein the core layer has a thickness from 20 to 150 nm.
62. A membrane for a lithographic apparatus having IR radiation emissivity of at least 0.1 and being substantially transmissive to EUV radiation, the membrane comprising a core layer from a material comprising Ru, wherein the core layer has a thickness from 20 to 30 nm.
63. A membrane assembly for a lithographic apparatus having IR radiation emissivity of at least 0.1 and being substantially transmissive to EUV radiation, the membrane assembly comprising at least two metal cap layers for improved IR emissivity, the metal cap layers comprising a metal which absorbs IR radiation and have a layer thickness of 20 nm or less, wherein the metal cap layers for improved IR emissivity are separated by a gap with thickness of 10 microns or less.
64. A membrane assembly according to clause 63, wherein the metal cap layers are each supported with a support layer which provides further mechanical strength.
65. A mask assembly comprising a lithographic mask and a frame coupled to the mask, the frame being arranged to support a membrane or membrane assembly according to any preceding clauses.
66. A lithographic apparatus comprising one or more membranes or a membrane assembly according to any preceding clauses.
67. A lithographic apparatus according to clause 66, wherein at least one of the membranes operates as a pellicle protecting a component from contamination.
68. The lithographic apparatus according to clause 67, further comprising a support constructed to support a patterning device, the patterning device being capable of imparting a radiation beam with a pattern in its cross-section to form a patterned radiation beam; wherein at least one of the membranes operates as a pellicle protecting the patterning device from contamination.
69. The lithographic apparatus according to clause 67 or clause 68, further comprising a projection system operable to project a patterned radiation beam onto a wafer, wherein at least one of the membranes operates as a pellicle protecting optical components within the projection system from contamination.
70. A lithographic apparatus according to any of clauses 66 to 69, wherein at least one of the membranes operates as a spectral filter membrane for blocking unwanted wavelengths of radiation.
71. A lithographic apparatus according to clause 70, wherein the spectral filter membrane is arranged under an angle in a scan direction of the lithographic apparatus, such that a radiation reflected by the membrane is not reflected back into the projection system.
72. A lithographic apparatus according to any of clause 70 or clause 71, wherein the spectral filter membrane for blocking unwanted wavelengths of radiation comprises a metal layer having a thickness less than the skin depth for IR radiation and more than 5 nm.
73. A lithographic apparatus according to clause 72, wherein the spectral filter membrane comprises a metal substantially transparent to EUV radiation selected from Ru, Mo, La, Rh, Be, Y, Zr, Ce, Nb and Pr.
74. A lithographic apparatus according to clause 73, wherein the spectral filter membrane comprises a (poly-)Si core layer and a Ru or Mo cap layer having a thickness from 5.5 to 10 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A membrane transmissive to EUV radiation, the membrane comprising:
one or more high doped regions where the membrane is doped with a high dopant concentration; and
one or more low doped regions where the membrane has no doping or a low dopant concentration,
wherein a high dopant concentration is defined as dopant concentration greater than $10^{17}$ $cm^{-3}$ and a low dopant concentration is defined as a dopant concentration less than $10^{17}$ $cm^{-3}$, and wherein IR emissivity of the one or more high doped regions is larger than IR emissivity of the one or more low doped regions.

2. A membrane as claimed in claim 1, wherein a main substrate supports the one or more high doped regions and one or more low doped regions, is comprised of a poly-Si material.

3. A membrane as claimed in claim 1, comprising a plurality of additional features on one or both surfaces of the membrane which are operable to increase transverse heat transfer.

4. A membrane for a lithographic apparatus, the membrane comprising:
a core layer of a thickness 60 nm or less, the core layer comprising a material, substantially transparent for radiation at an EUV wavelength, selected from: (poly-)Si, $Si_3N_4$, SiC, ZrN, $ZrB_2$, ZrC, $MoB_2$, MoC, $RuB_2$, $LaB_2$, LaC, $TiB_2$, TiC, (poly-)crystalline Yttrium, (poly-)crystalline Zr, Be, C, B or $B_4C$, and
a cap layer for improved IR emissivity comprising a material which absorbs IR radiation and having a layer thickness of 20 nm or less,
wherein combination of at least the core layer and cap layer of the membrane has IR radiation emissivity of at least 0.1 and is transmissive to 85% or more of radiation at the EUV wavelength.

5. A membrane according to claim 4, wherein the membrane has a cap layer—core layer—cap layer sandwich-like configuration.

6. A membrane according to claim 4, wherein the membrane has a core layer—cap layer—core layer sandwich-like configuration.

7. A membrane according to claim 4, wherein the core layer is a multilayer stack comprising one or more layers selected from: (poly-)Si, $Si_3N_4$, SiC, ZrN, $ZrB_2$, ZrC, $MoB_2$, MoC, $RuB_2$, $LaB_2$, LaC, $TiB_2$, TiC, (poly-)crystalline Yttrium, (poly-)crystalline Zr, Be, C, B or $B_4C$.

8. A membrane according to claim 4, wherein the core layer material is a composite material comprising a metal and non-metallic EUV transparent impurities dispersed therein.

9. A membrane according to claim 4, wherein the cap layer for improved IR emissivity is a metal layer.

10. A membrane according to claim 9, wherein the metal cap layer has a thickness $D=n\lambda/2$, with n being an integer equal to 3 or more and $\lambda$ being a wavelength of the EUV radiation used for lithographic exposure.

11. A membrane according to claim 4, wherein the EUV membrane comprises two metal cap layers for improved IR emissivity separated by a core layer, the cap and core layers being arranged such that destructive interference of EUV radiation occurs on the two metal cap layers and thereby the resulting EUV reflection is zero.

12. A membrane according to claim 4, wherein the core layer comprises (poly-)Si and the cap layer for improved IR emissivity comprises at least one selected from: Ti, Nd, Pr, Nb, La, Zr, B, Y, Be, $ZrO_2$, $MoSi_2$, $ZrSi_2$ or $NbSi_2$.

13. A membrane according to claim 4, wherein the core layer comprises B, $B_4C$ or Be and has a thickness of 25 nm or less.

14. A membrane according to claim 4, wherein the core layer is a multilayer core comprising up to 20 pairs of B or $B_4C$ and graphene, wherein the layer thickness ratio is 10 nm B or $B_4C/3$ nm graphene.

15. A membrane according to claim 4, wherein the core layer is a multilayer core comprising up to 20 pairs of $SiN_x$ and graphene, wherein the layer thickness ratio is 10 nm $SiN_x/2$ nm graphene.

16. A membrane according to claim 13, wherein the core layer is a B or $B_4C$ layer of thickness selected from 5-15 nm and wherein the cap layer for improved IR emissivity is a (poly-)crystalline Y, Ru or Mo layer with a thickness of 1-3 nm.

17. A membrane according to claim 4, wherein the core layer has a thickness of 16 nm or less and comprises a carbon-based material.

18. A membrane according to claim 4, wherein the core layer comprises silicon nitride and has a thickness of 15 nm or less.

19. A membrane according to claim 4, wherein the core layer comprises (poly-)crystalline yttrium and has a thickness of 50 nm or less.

20. A membrane according to claim 4, wherein the core layer comprises polycrystalline Zr and has a thickness of 25 nm or less.

21. A membrane for a lithographic apparatus having IR radiation emissivity of at least 0.1 and being substantially transmissive to EUV radiation, the membrane comprising a core layer from a material comprising Ru, wherein the core layer has a thickness from 20 to 30 nm.

22. A membrane assembly for a lithographic apparatus, the membrane assembly having IR radiation emissivity of at least 0.1 and being substantially transmissive to EUV radiation, the membrane assembly comprising at least two metal cap layers for improved IR emissivity, the metal cap layers each comprising a metal which absorbs IR radiation and each having a layer thickness of 20 nm or less, wherein adjacent ones of the metal cap layers are separated by a distance selected from the range of about 1-10 microns or separated by a distance of about $n\lambda/2$ such that destructive interference occurs between the metal layers, with n being an integer equal to 1 or more and $\lambda$ being a wavelength of the EUV radiation used for lithographic exposure.

23. A mask assembly comprising a lithographic mask and a frame coupled to the mask, the frame supporting a membrane as claimed in claim 1.

24. A lithographic apparatus comprising one or more membranes as claimed in claim 1.

25. A membrane for a lithographic apparatus, the membrane comprising:
a core layer of a thickness 60 nm or less, the core layer comprising a material, substantially transparent for radiation at an EUV wavelength, selected from: poly-Si, $ZrB_2$, $MoB_2$, $RuB_2$, $LaB_2$, LaC, $TiB_2$, TiC, poly-crystalline Y, poly-crystalline Zr, Be, B or $B_4C$, and
a cap layer for improved IR emissivity comprising a material which absorbs IR radiation and having a layer thickness of 20 nm or less,
wherein combination of at least the core layer and cap layer of the membrane has IR radiation emissivity of at least 0.1.

26. A membrane according to claim 25, wherein the core layer comprises at least poly-Si.

27. A membrane according to claim 25, wherein the cap layer comprises at least one selected from: Ru, Mo, Zr, or B.

28. A pellicle assembly for a lithographic mask, the pellicle assembly comprising a frame arranged to be coupled to the lithographic mask and the frame supporting the membrane as claimed in claim 25.

* * * * *